(12) United States Patent
Xu et al.

(10) Patent No.: US 10,297,218 B2
(45) Date of Patent: May 21, 2019

(54) ARRAY SUBSTRATE, DRIVING METHOD THEREOF, AND RELATED DISPLAY APPARATUS

(71) Applicants: BOE TECHNOLOGY GROUP CO., LTD., Beijing (CN); Chongqing BOE Optoelectronics Technology CO., Ltd., Chongqing (CN)

(72) Inventors: Zhuo Xu, Beijing (CN); Rui Wang, Beijing (CN); Yajie Bai, Beijing (CN); Jaikwang Kim, Beijing (CN); Fei Shang, Beijing (CN); Haijun Qiu, Beijing (CN)

(73) Assignees: BOE TECHNOLOGY GROUP CO., LTD., Beijing (CN); Chongqing BOE Optoelectronics Technology CO., Ltd., Chongqing (CN)

( * ) Notice: Subject to any disclaimer, the term of this patent is extended or adjusted under 35 U.S.C. 154(b) by 85 days.

(21) Appl. No.: 15/534,195

(22) PCT Filed: Dec. 22, 2016

(86) PCT No.: PCT/CN2016/111467
§ 371 (c)(1),
(2) Date: Jun. 8, 2017

(87) PCT Pub. No.: WO2017/215228
PCT Pub. Date: Dec. 21, 2017

(65) Prior Publication Data
US 2018/0197495 A1   Jul. 12, 2018

(30) Foreign Application Priority Data

Jun. 15, 2016   (CN) .......................... 2016 1 0425536

(51) Int. Cl.
*G09G 3/36* (2006.01)
*G02F 1/1362* (2006.01)
(Continued)

(52) U.S. Cl.
CPC ......... *G09G 3/3655* (2013.01); *G02F 1/1362* (2013.01); *G02F 1/1368* (2013.01);
(Continued)

(58) Field of Classification Search
CPC ... H01L 27/12; H01L 27/3276; H01L 27/124; G09G 3/3614; G09G 3/3648;
(Continued)

(56) References Cited

U.S. PATENT DOCUMENTS 5,319,480 A * 6/1994 McCartney ....... G02F 1/136213
349/144
5,576,858 A * 11/1996 Ukai ................. G02F 1/136213
349/139
(Continued)

FOREIGN PATENT DOCUMENTS

CN   101308271 A   11/2008
CN   101598879 A   12/2009
(Continued)

OTHER PUBLICATIONS

International Search Report & Written Opinion dated Mar. 20, 2017 regarding PCT/CN2016/111467.

*Primary Examiner* — Christopher E Leiby
(74) *Attorney, Agent, or Firm* — Intellectual Valley Law, P.C.

(57) ABSTRACT

The present application discloses an array substrate, a driving method thereof, and related display apparatus based on an improved dual-gate scheme. The array substrate includes multiple groups each having two columns of pixel electrodes without laying a data line in a gap between the two columns. Each group includes multiple second transistors for precharging respective pairs of pixel electrodes having reversed polarities in each corresponding scanning cycle. Before each pixel electrode is charged via a first transistor, turning on the second transistor allows charge sharing between the two pixel electrodes having reversed polarities so that the charging time of each pixel electrodes is substantially reduced and the operation power is saved.

20 Claims, 17 Drawing Sheets

(51) Int. Cl.
| | |
|---|---|
| *G02F 1/1368* | (2006.01) |
| *H01L 27/12* | (2006.01) |
| *G09G 3/3225* | (2016.01) |
| *G02F 1/1343* | (2006.01) |
| *H01L 27/32* | (2006.01) |
| *H01L 51/52* | (2006.01) |

(52) U.S. Cl.
CPC ......... *G09G 3/3225* (2013.01); *G09G 3/3614* (2013.01); *G09G 3/3648* (2013.01); *H01L 27/12* (2013.01); *H01L 27/124* (2013.01); *G02F 1/13624* (2013.01); *G02F 1/134336* (2013.01); *G02F 1/136286* (2013.01); *G09G 2300/0426* (2013.01); *G09G 2300/0439* (2013.01); *G09G 2300/0861* (2013.01); *G09G 2310/0251* (2013.01); *G09G 2320/0204* (2013.01); *G09G 2330/021* (2013.01); *G09G 2340/0407* (2013.01); *H01L 27/3276* (2013.01); *H01L 51/5206* (2013.01)

(58) Field of Classification Search
CPC ............... G09G 3/3655; G09G 3/3225; G09G 2300/0439; G09G 2300/0861; G09G 2310/0251; G09G 2320/0204; G02F 1/1362; G02F 1/1368; G02F 1/13624; G02F 1/134336; G02F 1/136286
See application file for complete search history.

(56) References Cited

U.S. PATENT DOCUMENTS

| | | | | |
|---|---|---|---|---|
| 5,748,276 A * | 5/1998 | Uno | ................. | G02F 1/136213 345/92 |
| 6,011,531 A * | 1/2000 | Mei | ......................... | G09G 3/20 345/90 |
| 6,710,825 B2 * | 3/2004 | Kubo | ................ | G02F 1/133707 349/143 |
| 7,084,842 B2 * | 8/2006 | Kim | ..................... | G09G 3/3659 345/698 |
| 7,102,630 B2 * | 9/2006 | Liu | ........................ | G09G 3/20 345/204 |
| 7,256,861 B2 * | 8/2007 | Park | ...................... | G02F 1/1362 345/173 |
| 7,548,285 B2 * | 6/2009 | Su | ....................... | G02F 1/13624 345/87 |
| 8,004,626 B2 * | 8/2011 | Ting | .................... | G02F 1/13624 349/144 |
| 8,102,493 B2 * | 1/2012 | Li | ......................... | G02F 1/1393 349/129 |
| 8,253,911 B2 * | 8/2012 | Kimura | ............... | G02F 1/13624 349/144 |
| 8,395,718 B2 * | 3/2013 | Kimura | ............... | G02F 1/13624 349/48 |
| 8,654,069 B2 * | 2/2014 | Mamba | ................ | G09G 3/3648 345/103 |
| 8,976,209 B2 * | 3/2015 | Tsubata | ............ | G02F 1/134336 345/694 |
| 2005/0036091 A1 * | 2/2005 | Song | .................. | G02F 1/133707 349/129 |
| 2005/0200788 A1 * | 9/2005 | Edwards | .............. | G09G 3/3648 349/139 |
| 2006/0164352 A1 * | 7/2006 | Yoo | ..................... | G02F 1/13624 345/87 |
| 2007/0164964 A1 * | 7/2007 | Ha | ....................... | G09G 3/3607 345/98 |
| 2009/0002586 A1 * | 1/2009 | Kimura | ............. | G02F 1/136213 349/39 |
| 2009/0027325 A1 * | 1/2009 | Kim | .................. | G02F 1/136286 345/92 |
| 2009/0027581 A1 * | 1/2009 | You | ..................... | G02F 1/13624 349/48 |
| 2009/0322660 A1 | 12/2009 | Chung et al. | | |
| 2011/0042676 A1 | 2/2011 | Ren | | |

FOREIGN PATENT DOCUMENTS

| | | |
|---|---|---|
| CN | 101995708 A | 3/2011 |
| CN | 202003648 U | 10/2011 |
| CN | 205809498 U | 12/2016 |
| KR | 20110064114 A | 6/2011 |

* cited by examiner

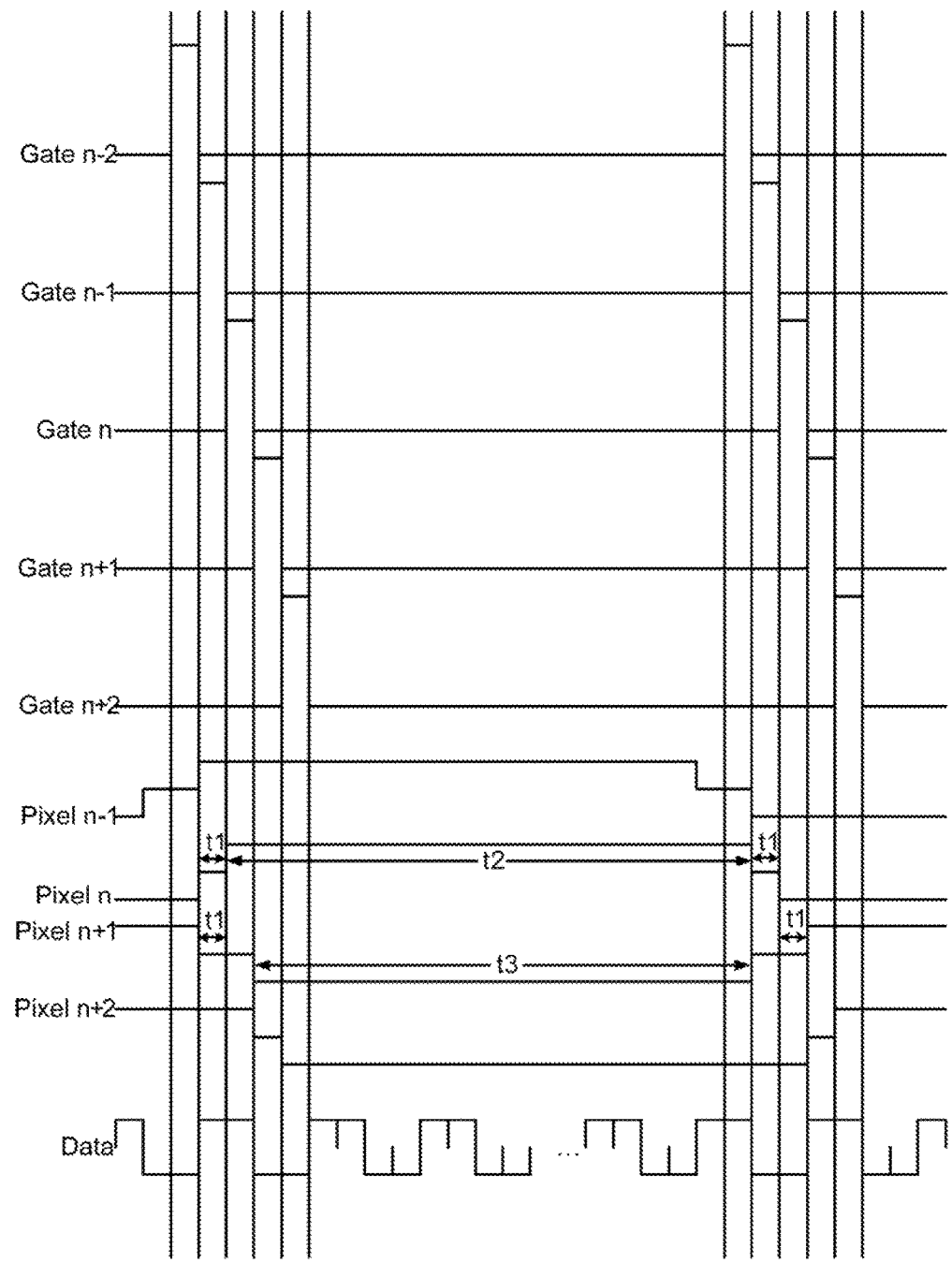

ARRAY SUBSTRATE, DRIVING METHOD THEREOF, AND RELATED DISPLAY APPARATUS

CROSS-REFERENCE TO RELATED APPLICATION

This application is a national stage application under 35 U.S.C. § 371 of International Application No. PCT/CN2016/11467 filed Dec. 22, 2016, which claims priority to Chinese Patent Application No. 201610425536.7, filed Jun. 15, 2016, the contents of which are incorporated by reference in the entirety.

TECHNICAL FIELD

The present invention relates to display technology field, and particularly to an array substrate, driving method thereof and related display apparatus.

BACKGROUND

In active matrix flat panel display, switch transistors are usually used to control charging or discharging of pixel electrodes. When the switch transistor is turned on, the corresponding pixel electrodes are charging during the on-time period. When the switch transistor is turned off, voltage drop on the pixel electrodes is maintained until they are re-charged during a next scanning period.

SUMMARY

In one aspect, the present invention provides an array substrate comprising a plurality of pixel electrodes arranged in a matrix; a plurality of data lines laid in a column direction; a plurality of gate lines laid in a row direction sequentially scanned row-by-row along the column direction in a plurality of scanning cycles; a plurality of first transistors configured to control charging of the plurality of pixel electrodes respectively; and a plurality of second transistors configured to control pre-charging of the plurality of pixel electrodes respectively; wherein every two adjacent columns of pixel electrodes in the array substrate form a group of pixel electrodes; the plurality of data lines and a plurality of groups of pixel electrodes are alternately disposed along the row direction; the plurality of data lines being absent between the two adjacent columns of pixel electrodes in a same group of pixel electrodes; each row of pixel electrodes is associated with two adjacent gate lines of the plurality of gate lines; any two adjacent pixel electrodes in each row at two opposite sides of any data line are coupled to the same data line respectively through two first transistors, and respectively coupled through the two first transistors to the two adjacent gate lines associated with the each row; each second transistor within the group of pixel electrodes is coupled to two pixel electrodes having respective polarities reversed during a scanning cycle for mutually sharing charges between the two pixel electrodes within the scanning cycle.

Optionally, each pixel electrode in one row of pixel electrodes comprises a first portion and a second portion arranged in the column direction and coupled by a conducting line, wherein one of the two adjacent gate lines associated with the row of pixel electrodes is disposed between the first portion and the second portion and another of the two adjacent gate lines associated with the row of pixel electrodes is disposed between the row of pixel electrodes and an adjacent row of pixel electrodes.

Optionally, the first portion and the second portion have a substantially the same area.

Optionally, the plurality of first transistors have a common gate layout toward one direction.

Optionally, each first transistor coupled to one of the two adjacent gate lines associated with each row of pixel electrodes has a common gate layout towards a first direction and each first transistor coupled to another of the two adjacent gate lines associated with each row of pixel electrodes has a common gate layout towards a second direction, the second direction being opposite to the first direction.

Optionally, the two adjacent gate lines associated with the each row of pixel electrodes is laid between two adjacent rows of pixel electrodes.

Optionally, for each group of pixel electrodes, except for those pixel electrodes associated with a first gate line of the array substrate that is firstly scanned in a first scanning cycle of the plurality of scanning cycles, each second transistor comprises a gate coupled to a pre-charge gate line and two terminals respectively coupled to two adjacent pixel electrodes in a row of pixel electrodes having reversed polarities from column to column, wherein the pre-charge gate line is one of the plurality of gate lines associated with an adjacent row of pixel electrodes scanned in a previous scanning cycle.

Optionally, for each group of pixel electrodes, except for those pixel electrodes associated with a first gate line of the array substrate that is firstly scanned in a first scanning cycle of the plurality of scanning cycles, each second transistor comprises a gate coupled to a pre-charge gate line and two terminals respectively coupled to two adjacent pixel electrodes in a row of pixel electrodes having reversed polarities both from row to row and from column to column, wherein the pre-charge gate line is one of the plurality of gate lines associated with an adjacent row of pixel electrodes scanned in a previous scanning cycle.

Optionally, for each group of pixel electrodes, except for those pixel electrodes associated with a first gate line of the array substrate that is firstly scanned in a first scanning cycle of the plurality of scanning cycles, each second transistor comprises a gate coupled to a pre-charge gate line and two terminals respectively coupled to a first pixel electrode and a second pixel electrode having reversed polarities from column to column, the first pixel electrode being in a first column of a row and the second pixel electrode being in an adjacent second column of a next adjacent row, wherein the pre-charge gate line is a first of two gate lines associated with the row of pixel electrodes where the first pixel electrode belong and scanned in a current scanning cycle.

Optionally, for each group of pixel electrodes, except for those pixel electrodes associated with a first gate line of the array substrate that is firstly scanned in a first scanning cycle of the plurality of scanning cycles, each second transistor comprises a gate coupled to a pre-charge gate line and two terminals respectively coupled to a first pixel electrode and a second pixel electrode having reversed polarities from row to row, the first pixel electrode being in a column of a row and the second pixel electrode being in a next adjacent column of a next adjacent row, wherein the pre-charge gate line is a first of two gate lines associated with the row of pixel electrodes where the first pixel electrode belong and scanned in a current scanning cycle.

Optionally, the plurality of second transistors comprises a first set of second transistors paired with a second set of second transistors, each of the first set of second transistors within a group of pixel electrodes comprises a gate coupled to a first pre-charge gate line and two terminals respectively coupled to two adjacent pixel electrodes in a first column of two adjacent rows having reversed polarities from row to row, each of the second set of second transistors within the same group of pixel electrodes comprises a gate coupled to a second pre-charge gate line and two terminals respectively coupled to two adjacent pixel electrodes in a second column of a same two adjacent rows, wherein the first pre-charge gate line is a first of two gate lines associated with a first row of the two adjacent rows of pixel electrodes and scanned in a current scanning cycle, the second pre-charge gate line is one of the plurality of gate lines associated with a previous adjacent row of pixel electrodes and scanned in a previous scanning cycle nearest to a current scanning cycle for scanning a first of two gate lines associated with the first row of the two adjacent rows.

Optionally, the plurality of second transistors comprises a first set of second transistors paired with a second set of transistors, each of the first set of second transistors within a group of pixel electrodes comprises a gate coupled to a first pre-charge gate line and two terminals respectively coupled to two adjacent pixel electrodes in a first column of two adjacent rows having reversed polarities both from row to row and from column to column, each of the second set of second transistors within the same group of pixel electrodes comprises a gate coupled to a second pre-charge gate line and two terminals respectively coupled to two adjacent pixel electrodes in a second column of a same two adjacent rows, wherein the first pre-charge gate line is a first of two gate lines associated with a first row of the two adjacent rows of pixel electrodes and scanned in a current scanning cycle, the second pre-charge gate line is one of the plurality of gate lines associated with a previous adjacent row of pixel electrodes and scanned in a previous scanning cycle nearest to a current scanning cycle for scanning a first of two gate lines associated with the first row of the two adjacent rows.

Optionally, each row of pixel electrodes is configured to have a same polarity within each scanning cycle and each adjacent row of pixel electrodes is configured to have a reversed polarity relative to previously said row of pixel electrodes, for each group of pixel electrodes, except for those pixel electrodes associated with a first gate line of the array substrate that is firstly scanned in a first of the plurality of scanning cycles, every two pixel electrodes located at the two adjacent rows having reversed polarities are mutually pre-charged via one of the plurality of second transistors within the scanning cycle.

Optionally, any two columns of pixel electrodes coupled to a same data line are configured to have a same polarity within each scanning cycle and two adjacent columns of pixel electrodes respectively coupled to two adjacent data lines are configured to have a reversed polarity relative to previously said two columns of pixel electrodes, for each group of pixel electrodes, except for those pixel electrodes associated with a first gate line of the array substrate that is firstly scanned in a first of the plurality of scanning cycles, every two pixel electrodes at the two adjacent columns having reversed polarities are mutually pre-charged via one of the plurality of second transistors within the scanning cycle.

Optionally, every two adjacent pixel electrodes having reversed polarities within each scanning cycle, for each group of pixel electrodes, except for those pixel electrodes associated with a first gate line of the array substrate that is firstly scanned in a first of the plurality of scanning cycles, every two pixel electrodes respectively at two adjacent rows or at two adjacent columns having reversed polarities are mutually pre-charged via one of the plurality of second transistors within the scanning cycle.

Optionally, the plurality of gate lines comprises a first set of gate lines respectively coupled to a set of second transistors and a second set of gate lines without coupled to any second transistors, each of the first set of gate lines comprises a line width wider than that of each of the second set of gate lines.

In another aspect, the present invention provides a display panel comprising the array substrate described herein.

In another aspect, the present invention provides a display apparatus comprising the display panel described herein.

In another aspect, the present invention provides a method for driving an array substrate described herein upon sequentially scanning the plurality of gate lines one by one in a series of scanning cycles, the method comprising, in each scanning cycle, applying signals of reversed polarities to any two adjacent data lines; and turning on the second transistor to allow charge sharing between the two pixel electrodes having reversed polarities, before each pixel electrode is charged via the first transistor.

In another aspect, the present invention provides a method for driving an array substrate described herein upon sequentially scanning the plurality of gate lines one by one in a series of scanning cycles, the method comprising, in each scanning cycle, applying signals of a first polarity to each data line while charging a current row of pixel electrodes, the first polarity being reversed relative to a second polarity for signals applied to each data line while charging a previous adjacent row of pixel electrodes, each pixel electrode being pre-charged from an adjacent data line with reversed polarity via the second transistor before being normally charged from a currently coupled data line via the first transistor.

In another aspect, the present invention provides a method for driving an array substrate described herein upon sequentially scanning the plurality of gate lines one by one in a series of scanning cycles, the method comprising, in each scanning cycle, applying signals of two reversed polarities to every two adjacent data lines while charging a current row of pixel electrodes, each pixel electrode being pre-charged from one of the two adjacent data lines polarity via the second transistor before being normally charged from another one of the two adjacent data lines having reversed polarity via the first transistor, the polarity on each data line being reversed relative to a polarity on the same each data line while charging a previous adjacent row of pixel electrodes.

BRIEF DESCRIPTION OF THE FIGURES

The following drawings are merely examples for illustrative purposes according to various disclosed embodiments and are not intended to limit the scope of the present invention.

FIG. 6B is a timing waveform for operating the array substrate of FIG. 6A.

DETAILED DESCRIPTION

Figure 1A:
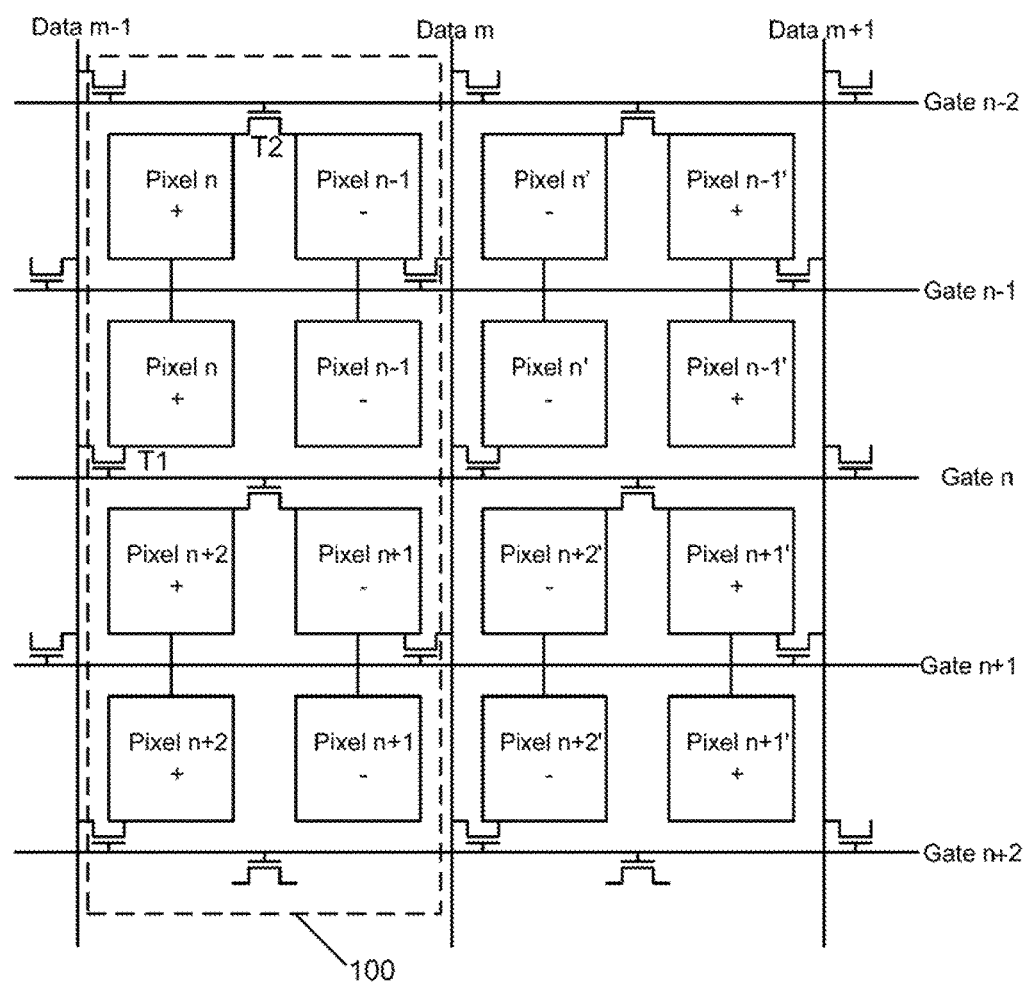
FIG. 1A is a first schematic circuit diagram of an array substrate according to some embodiments of the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a conventional Dual Gate array substrate, the number of data lines is reduced in half so that the numbers of pins of source IC can be reduced in half for lowering manufacturing cost. However, conventional Dual Gate scheme causes insufficient charging on the pixel electrodes, limiting the display having Dual Gate array substrate to be applied to high-resolution image display products. For example, for a normal display panel having a×b resolution and 60 Hz pixel refresh rate, each frame has a display time of ⅟₆₀ s. In each scanning period, it needs to scan over all b rows of gate lines. In order to avoid signal crosstalk, a pulse width of a single pixel signal applied to a corresponding data line should be ⅟₆₀b s. For a display panel with dual gate array substrate, in each frame it needs to scan over all 2b rows of gate lines. Then the pulse width of a single pixel signal applied to a corresponding data line should be ⅟₁₂₀b s, resulting in a charging time to be just half of that of the normal display panel. Therefore, for the, actual charging rate among the display products with same a×b resolution will be substantially reduced or even failed to perform normal image display when the charging time of the pixel electrodes is cut in half.

Accordingly, the present disclosure provides, inter alia, an array substrate, a display apparatus having the same, and a driving method that substantially obviate one or more of the problems due to limitations and disadvantages of the related art. In one aspect, the present disclosure provides an array substrate a plurality of pixel electrodes arranged in a matrix along a row direction and a column direction, a plurality of data lines laid in the column direction, a plurality of gate lines laid in the row direction and configured to be scanned one-by-one along the column direction sequentially in a plurality of scanning cycles, a plurality of first transistors configured to control charging of the plurality of pixel electrodes respectively, and a plurality of second transistors configured to pre-charge the plurality of pixel electrodes respectively. In some embodiments, every two adjacent columns of pixel electrodes in the array substrate form a group of pixel electrodes, the plurality of data lines and a plurality of groups of pixel electrodes are alternately disposed along the row direction; the plurality of data lines being absent between the two adjacent columns of pixel electrodes in a same group of pixel electrodes, each row of pixel electrodes is associated with two adjacent gate lines of the plurality of gate lines, any two adjacent pixel electrodes in each row at two opposite sides of any data line are coupled to the same data line respectively through two first transistors and respectively coupled through the two first transistors to the two adjacent gate lines associated with the each row, and each second transistor within the group of pixel electrodes is coupled to two pixel electrodes having respective polarities reversed from row to row or from column to column or both during a corresponding scanning cycles for mutually sharing charges between the two pixel electrodes within the scanning cycles.

FIG. 1A is a first schematic circuit diagram of an array substrate according to some embodiments of the present disclosure. Referring to FIG. 1A, the array substrate includes a plurality of pixel electrodes Pixel, a plurality of gate lines Gate, a plurality of data lines Data, a plurality of first transistors T1 respectively coupled to the plurality of pixel electrodes for controlling charging of each pixel electrode, and a plurality of second transistors T2 for pre-charging respective plurality of pixel electrodes.

Referring to FIG. 1A, the array substrate can be divided into multiple groups. Each group 100 includes two adjacent columns of pixel electrodes Pixel. The plurality of data lines Data all formed in parallel along the column direction, respectively in a gap between any two adjacent groups and at two outer boundaries of two out-most groups. Each data line Data is coupled to each pixel electrode adjacent to itself via one of the plurality of first transistors T1.

Referring to FIG. 1A, every row of pixel electrodes Pixel is associated with two gate lines Gate, for example, a first gate line Gate n+1 and a second gate line Gate n+2. Each gate line is scanned within a time period named as a corresponding scanning cycles. The pixel array is configured to be scanned one row after another in sequential time order along the column direction. Here n is an integer representing an ascending sequential order for the gate lines to scanned (by applying a control signal thereof) in corresponding scanning cycles. In every row of pixel electrodes Pixel, any two pixel electrodes Pixel located at two different sides of one data line Data are respectively coupled to the two gate lines through two of the plurality of first transistors T1. For example, Pixel n+1 on the adjacent left side of data line Data m is coupled to the first gate line Gate n+1 via a first transistor and Pixel n+2' on the adjacent right side of the same data line Data m is coupled to the second gate line Gate n+2 via another first transistor.

Through each data line display signals can be sent as voltage signals with different polarities to those pixel electrodes that coupled to itself via the first transistors within each scanning cycles with a corresponding gate line being scanned for controlling a row of pixel electrodes. For example, Pixel n is applied with a positive polarity and Pixel n−1 is applied with a negative polarity, a reversed polarity relative to that of Pixel n. For each group 100 of pixel electrodes, every two pixel electrodes having reversed polarities within the scanning cycle can be coupled via one of the plurality of second transistors T2 for mutually sharing charges to achieve a pre-charging function.

In some embodiments, the array substrate provided in the present disclosure is based on a dual-gate scheme. Additionally, in each group 100 of pixel electrodes no data line Data is laid in a gap between the two adjacent columns. Multiple second transistors T2 are disposed in the gap so that the second transistors are not crossed over by the data line Data to induce any crosstalk issue in the data signals. In each group 100 of pixel electrodes, each two pixel electrodes having reversed polarities within a current scanning cycle, optionally except some pixel electrodes in a first row that connect to a first gate line scanned for the first row of pixel electrodes in the current scanning cycle, can be coupled for mutually pre-charging through a second transistor T2. In other words, before each pixel electrode Pixel is charged through a first transistor T1, the second transistor 12 is turned on to allow charge sharing between two pixel electrodes having reversed polarities. The charge neutralization at each pixel electrode Pixel before it is charged can help raising the starting level for charging and subsequently reducing charging time to same power.

In some embodiments, the array substrate is provided not only to use a dual-gate scheme for cost saving but also to add a second transistor T2 for pre-charging each pair of pixel electrodes to achieve fast charging and raise pixel refresh frequency. The pre-charging through charge sharing between two electrodes having reversed polarities can reduce logic circuit power.

Figure 2:
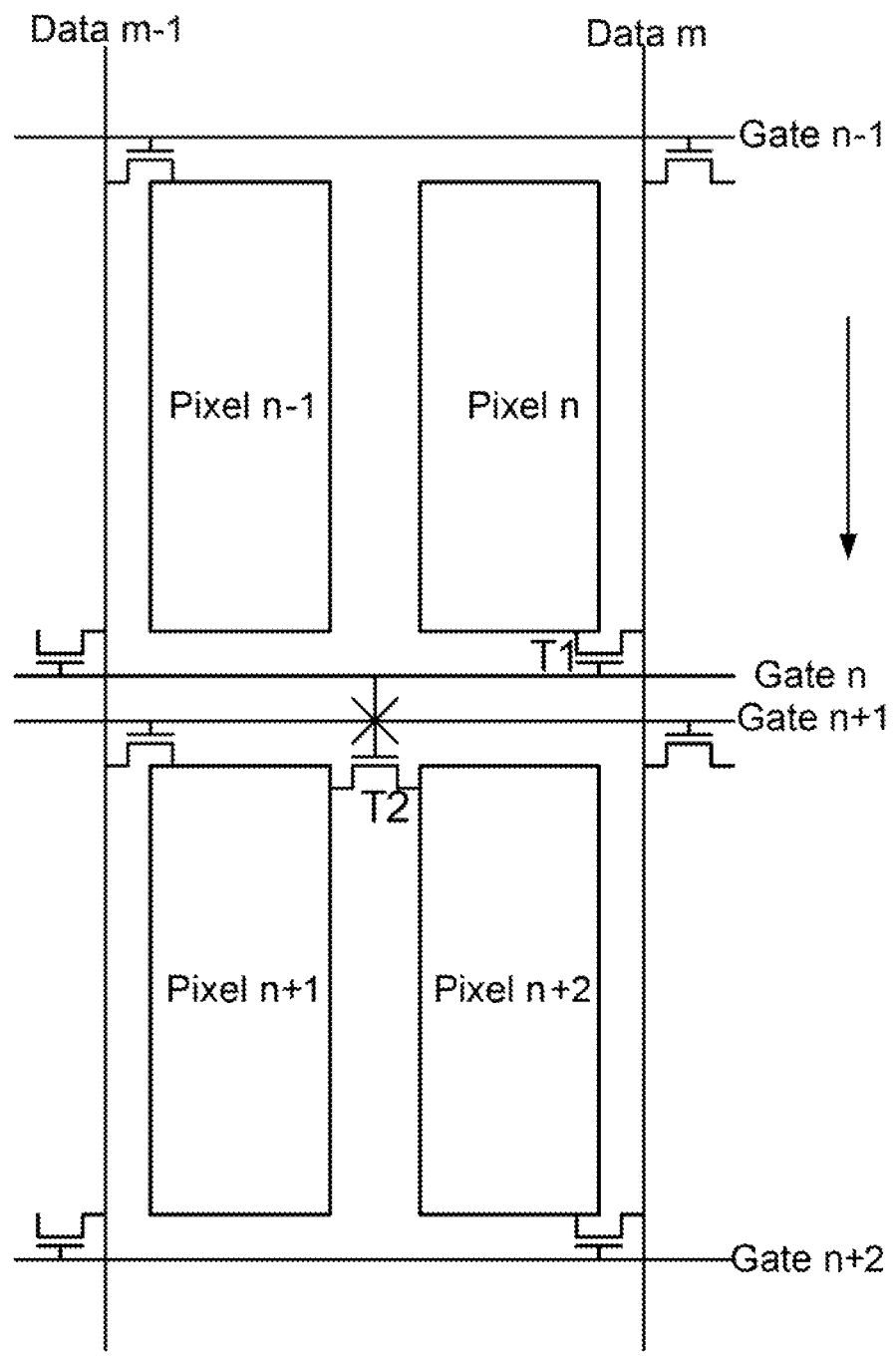
FIG. 2 is a schematic circuit diagram of an array substrate with conventional dual-gate scheme.

The array substrate of the present disclosure is transformed from a traditional dual-gate structure by adding a second transistor per a pair of pixels. In particular, FIG. 2 is a schematic circuit diagram of an array substrate with the conventional dual-gate scheme. As shown, within a gap between two rows of pixel electrodes two gate lines, Gate n and Gate n+1, are coupled to the two rows of pixel electrodes respectively through corresponding first transistors T1. When the array substrate is performing gate line Gate scanning (or activation) along the arrow direction, the previously scanned gate line Gate n cannot cross the adjacent gate line Gate n+1 to connect with the added second transistors T2 for performing charge sharing between two pixel electrodes in next adjacent row, Pixel n+1 and Pixel n+2.

The array substrate of FIG. 1A is configured to avoid the above issue of one gate line having to cross another gate line for connecting to the pre-charging transistor T2. Referring to FIG. 1A, each pixel electrode Pixel is divided into a first (upper) portion and a second (lower) portion linked by a conduction line. One gate line, e.g., Gate n−1, is relocated into a region between the first portion and the second portion of the first row of pixel electrodes as shown in FIG. 1A. Another gate line, e.g., Gate n, is disposed in the gap between the first row of pixel electrodes and the next adjacent row of pixel electrodes, as shown in FIG. 1A.

In some embodiments, each pixel electrode is divided into the first portion and the second portion each occupying substantially an equal area. Effectively, the traditional dual-gate structure is transformed from a layout of two gate-lines per row to one gate-line per 0.5 rows. As seen in FIG. 1A, the number of gate lines inside the gap between two adjacent rows of pixel electrodes is reduced (from 2 to 1). A second transistor T2 is disposed between two adjacent gate lines so that the second transistor T2 is avoided to cross one gate line to connect with the adjacent gate line.

Figure 3A:
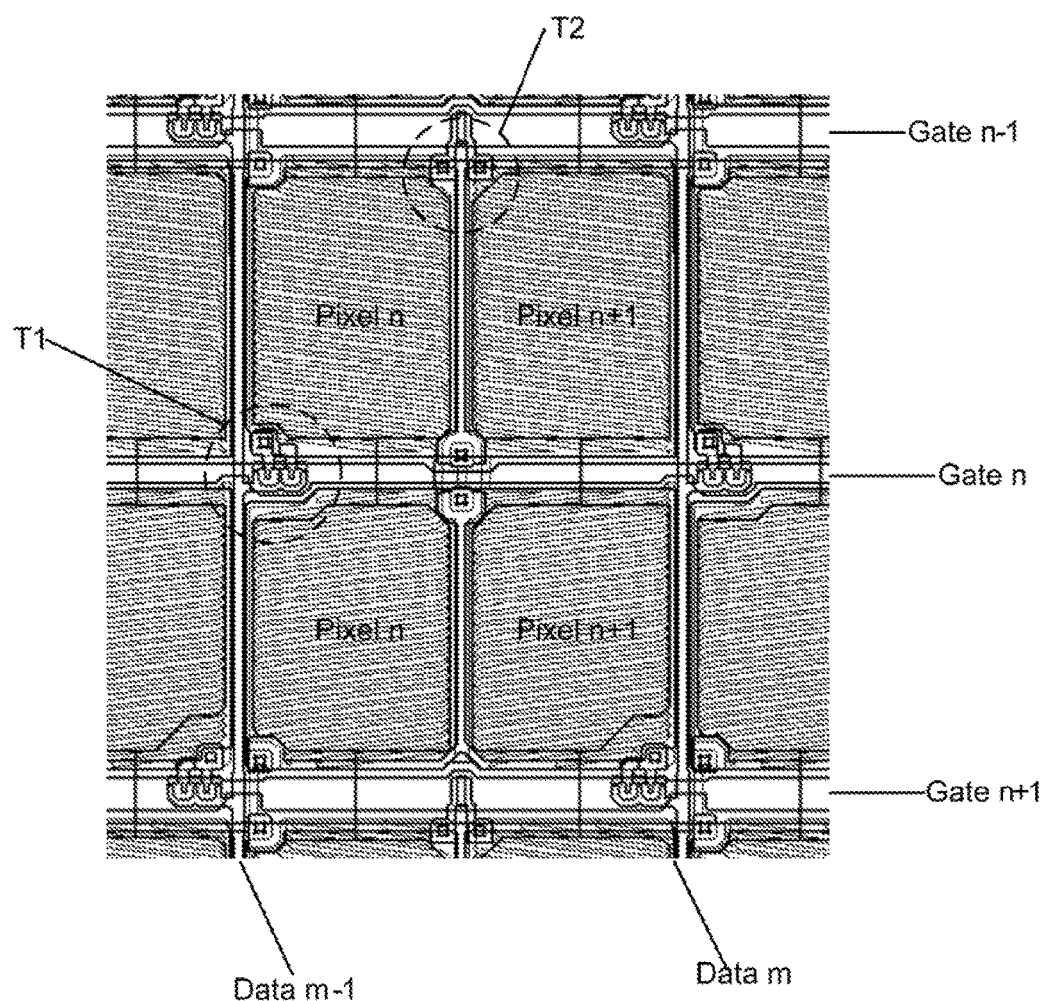
FIG. 3A is a regional view of a circuit layout of an array substrate according to some embodiments of the present disclosure.
Figure 3B:
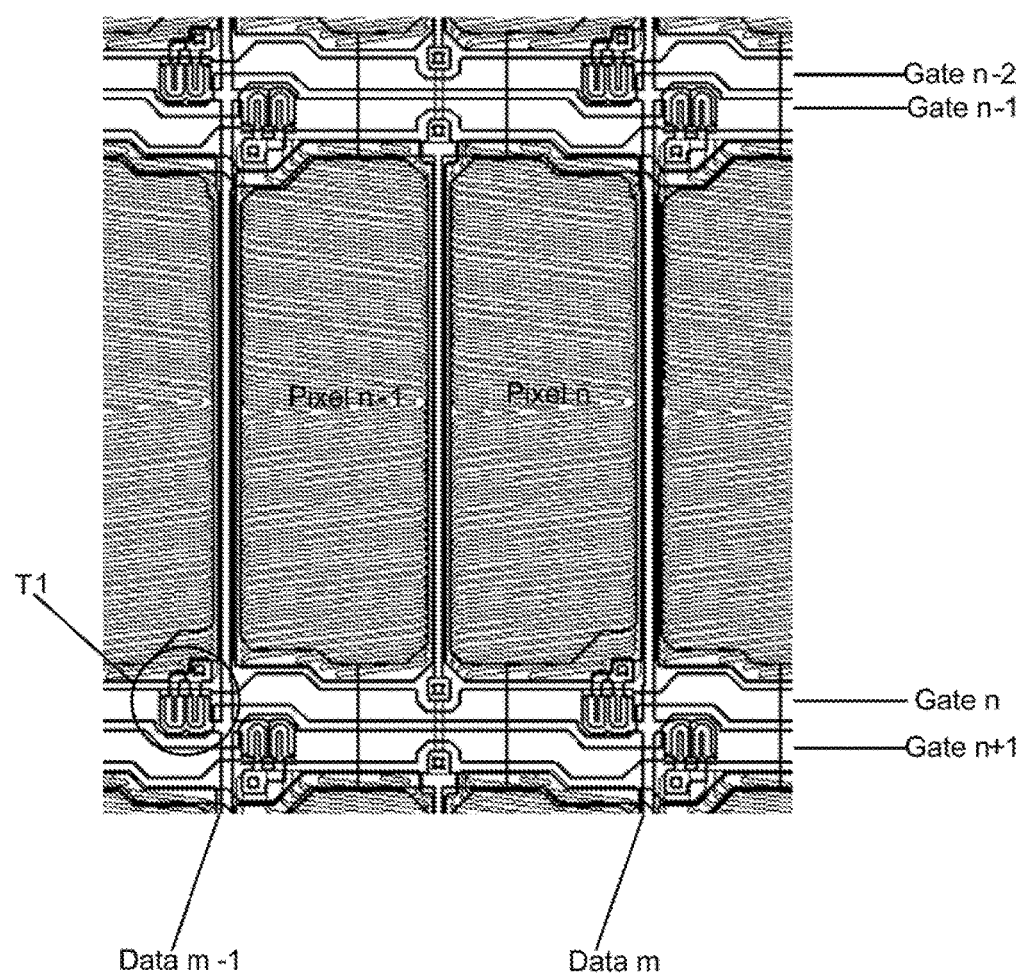
FIG. 3B is a regional view of a circuit layout of an array substrate with conventional dual-gate scheme.

FIG. 3A is a regional view of a circuit layout of an array substrate according to some embodiments of the present disclosure. FIG. 3B is a regional view of a circuit layout of an array substrate with conventional dual-gate scheme. In a specific implementation, as shown in FIG. 3A, a relative wide assembly margin is provided to vertical boundary regions of the array substrate that forms a display panel. When the gate line layout becomes a scheme of one gate-line per 0.5 row, an extra black matrix region needs to be added between the first portions and the second portions along the row direction to cover the gate line disposed thereof. This will cause some loss in transmittance of the display panel comparing to that of another display panel having a traditional dual-gate structure without diving each pixel electrode into two halves. For example, an aperture ratio of each pixel electrode is reduced from about 68.1% for current dual-gate scheme to about 65.9% for traditional dual-gate scheme, down by 3.2%. But the advantage of the pixel electrode with the current dual-gate scheme on saving logic circuitry power is much greater than the above negative impact on loss in transmittance.

Figure 4A:
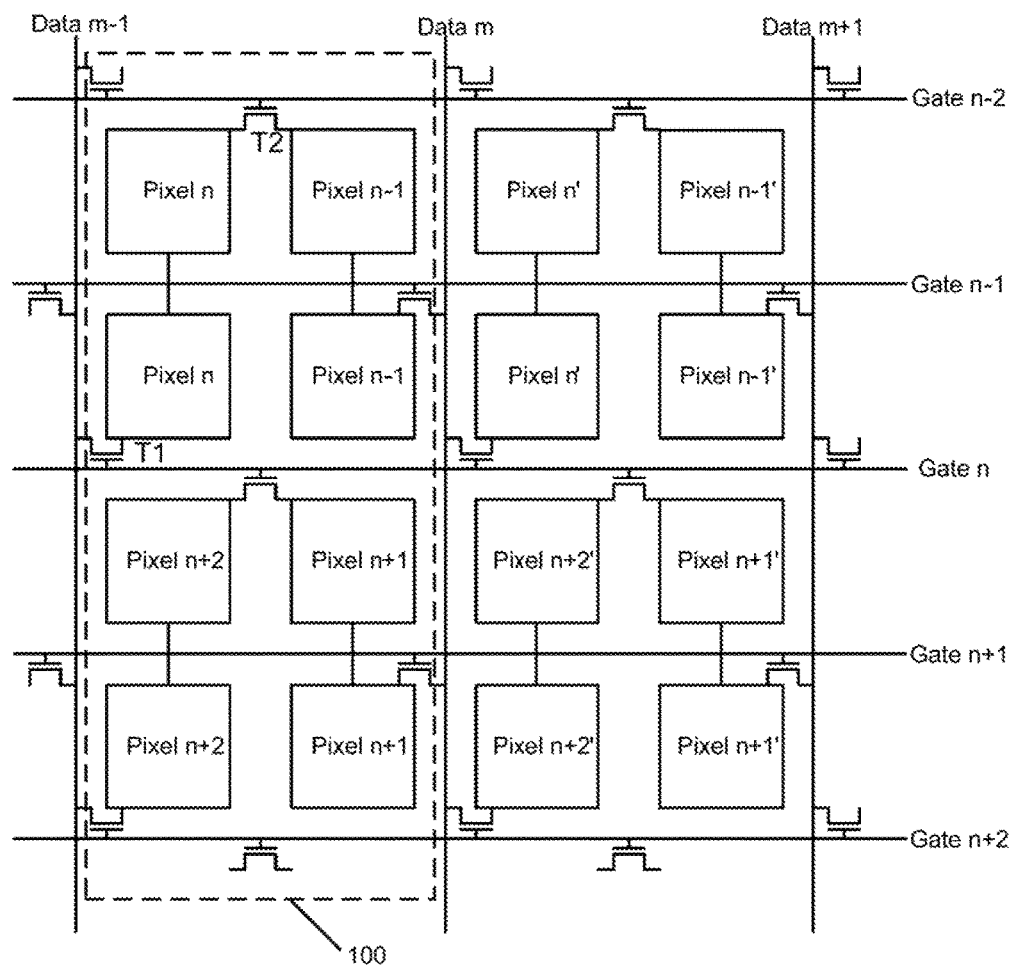
FIG. 4A is a second schematic circuit diagram of an array substrate according to some embodiments of the present disclosure.

In some embodiments, for the dual-gate scheme with one gate line per 0.5 row, as shown in FIG. 1A, each first transistor T1 can be laid with just one orientation. For example, all gates of respective first transistors T1 are made along the column direction towards a last row of the array substrate. Alternatively, as shown in FIG. 4A, for every two adjacent gate lines, Gate n and Gate n+1, all the first transistors T1 coupled to the Gate n are laid with an opposite orientation relative to all the first transistors T1 coupled to the Gate n+1. FIG. 4A shows an array substrate that is the closest to the traditional array substrate with dual-gate scheme as shown in FIG. 2. However, because of adding different orientation to part of the plurality of first transistors T1, array substrate process becomes more complicate and harder to control.

Figure 4B:
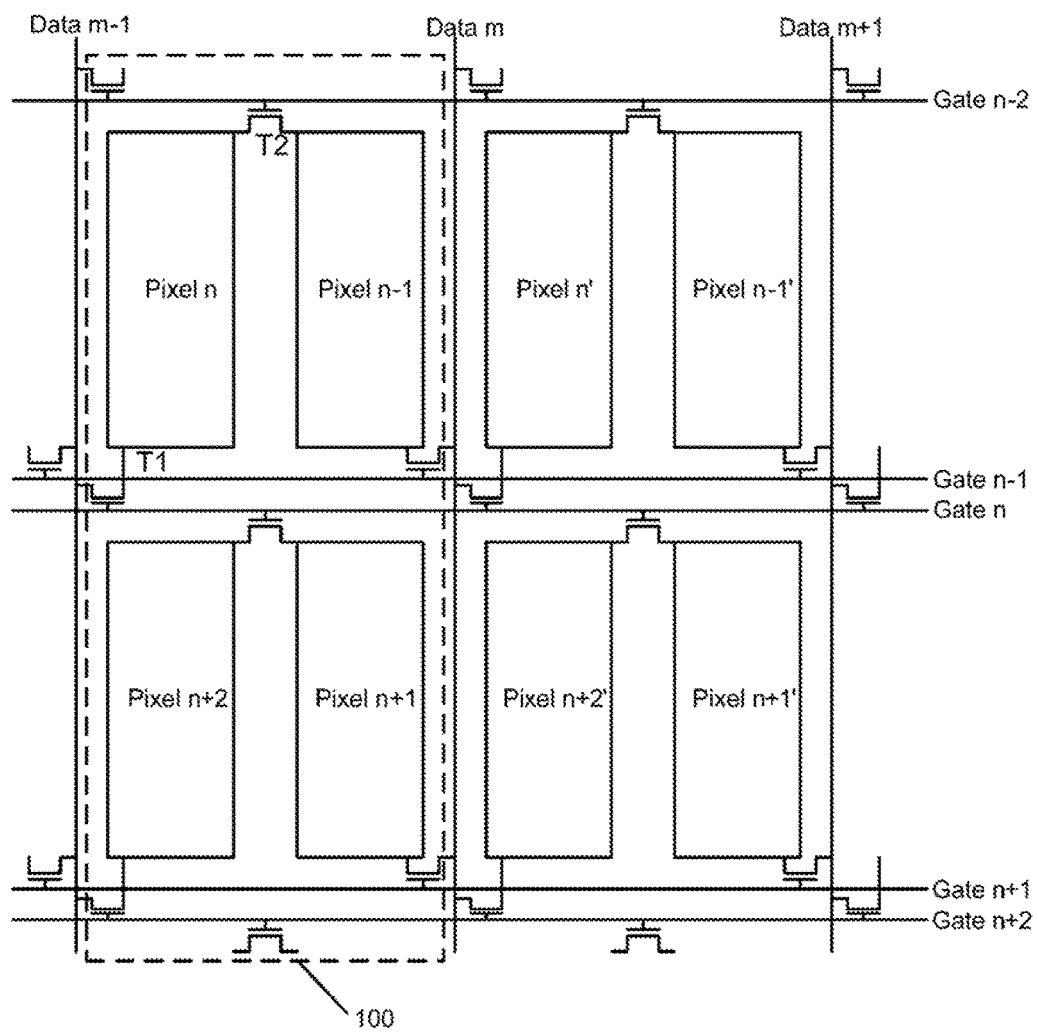
FIG. 4B is a third schematic circuit diagram of an array substrate according to some embodiments of the present disclosure.

FIG. 4B is a third schematic circuit diagram of an array substrate according to some embodiments of the present disclosure. This array substrate is configured to keep two gate lines disposed inside the gap between any two rows of pixel electrodes the same as the traditional array substrate of FIG. 2. For example, Gate n−1 and Gate n are two gate lines laid between the top row and the bottom row of FIG. 4B. Both Gate n−1 and Gate n are associated with the top row of pixel electrodes by respectively connecting via two first transistors T1 with the same layout orientation. The first transistor that is coupled to the farther one gate line Gate n relative to the top row of pixel electrodes has a source line crossing the other gate line Gate n−1 for connecting to a corresponding pixel electrode Pixel n. The array substrate shown in FIG. 4B needs less black matrix region than the array substrate shown in FIG. 4A where each pixel electrode is divided into two halves so that the loss of pixel transmittance can be reduced. However, a parasitic capacitance can be generated due to crossing of the source line of the first transistor T1 over the Gate n−1, which is a side effect that needs to be eliminated by additional efforts.

Referring to FIG. 4A or FIG. 4B, not all of the plurality of gate lines in the array substrate are coupled to the second transistors T2 (for pre-charging purpose). Then different gate lines may have different capacitance depending on whether it is coupled to a second transistor T2 or not. In general, the gate line that is coupled to a second transistor has larger capacitance than the gate line that is not coupled to a second transistor. In order to balance the likely difference in line capacitance between different gate lines, a resistor may be added to those gate lines that have relative smaller capacitances. For example, the line width of those gate lines can be reduced to raise the resistance for compensating signal RC delay so that the charging rates on the pixel electrodes controlled by different gate lines are kept the same. In a specific embodiment of the array substrate in the present disclosure, the gate lines that are coupled to the second transistors have their line width being set to be larger than that for the gate lines that are not coupled to the second transistors.

In some embodiments, in the array substrate a pre-charging operation is performed to two pixel electrodes having opposite or reversed polarities through a second transistor T2 before they are normally charged. Each second transistor has a source terminal and a drain terminal respectively coupled to two pixel electrodes which are coupled to two different gate lines via corresponding two first transistors. In order to make the time for pre-charging as short as possible, e.g., to make a transient effect of the pre-charging operation as small as possible or substantially negligible relative to normal charging operation on each pixel electrode, the source terminal and the drain terminal of the second transistor T2 can be respectively coupled to two pixel electrodes that are respectively charged in two adjacent rows. Additionally, the gate (or control) terminal of each second transistor T2 is coupled to a gate line that is a previous adjacent gate line relative to one of the two adjacent rows that is firstly charged or activated via a corresponding gate line (which is next to the previous adjacent gate line). For example, as shown in FIG. 1A, the source terminal and the drain terminal of the second transistor T2 are respectively coupled to Pixel n+1 and Pixel n+2. The Pixel n+1 is coupled to a gate line Gate n+1 and the Pixel n+2 is coupled to another gate line Gate n+2. Therefore, the gate terminal of the second transistor is preferred to be coupled to the gate line Gate n.

In some embodiments, all the array substrates disclosed above and additional ones in subsequent sections of the specification can be driven, not limited, by data line signals with different polarity reversion including column-to-column reversion, or row-to-row reversion, or point reversion. Depending on specific types of polarity reversion of data line signals, locations of the two pixel electrodes that are coupled to a second transistor T2 will be different within the array substrate (or specifically within each group of the array substrate). In the detailed descriptions below, a dual-gate scheme of one gate line per 0.5 rows of pixel electrodes is applied as an example in several specific embodiments.

Embodiment I

The array substrate is adopted a column-reverse polarity scheme for driving its operation. In other words, within each scanning cycle, a certain polarity is applied to a data line signal with reversed polarities being applied to signals on any two adjacent data lines. The two columns of pixel electrodes that are located at either side of the data line and coupled via first transistors T1 to this data line all pave the same polarity. While, all pixel electrodes coupled to two adjacent data lines relative to this data line have a reversed polarity.

Figure 1B:
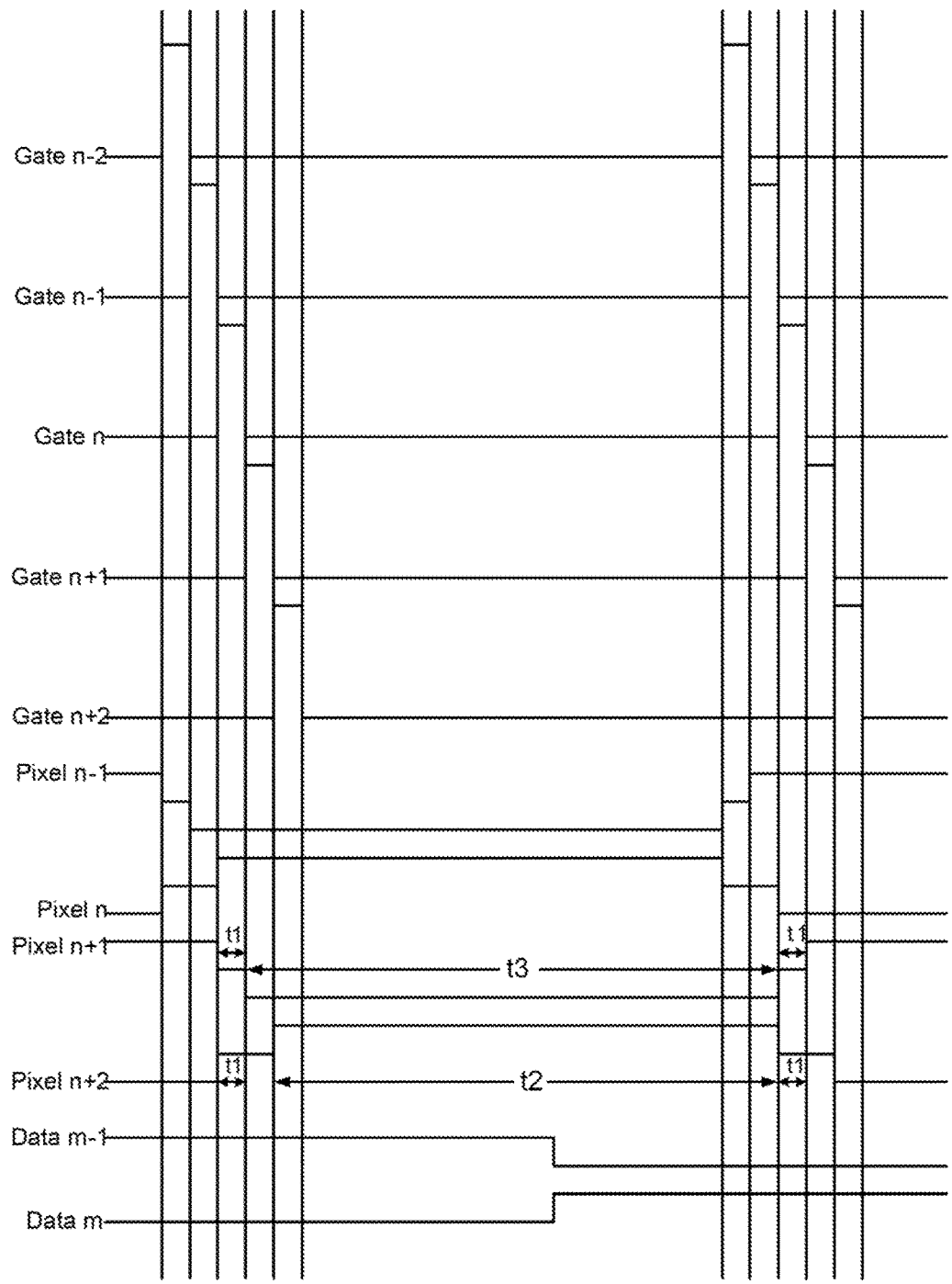
FIG. 1B is a timing waveform for operating the array substrate of FIG. 1A.

In the column-reverse polarity scheme, for each group 100 of pixel electrodes, two pixel electrodes of a same row have opposite or reversed polarities. These two pixel electrodes are charged through a gate line associated with an adjacent row. Referring to FIG. 1A, except for those pixel electrodes associated with a gate line that is first scanned by a gate-driving control signal), any two pixel electrodes adjacent in one row of all rows of pixel electrodes are mutually pre-charged through a second transistor T2. In particular, in each group 100 of pixel electrodes, two pixel electrodes of a same row are respectively coupled to a source terminal and a drain terminal of a second transistor T2. The gate of the second transistor is coupled to a previous adjacent gate line located in the gap between the current row and a previous adjacent row. For example, both Pixel n+1 and Pixel n+2 connect to the second transistor T2 for mutually pre-charging. The gate of the second transistor T2 is coupled to Gate n. Referring to FIG. 1B, the timing waveform diagram shows that each pixel electrode in the two pixel electrodes coupled to the second transistor T2 is subjected to a neutralization of positive and negative polarities before it is started to be charged. Therefore, the starting potential level for charging is raised by 50%. Theoretically, this results in 50% power saving in logic circuitry operation and cuts the charging time by half.

Referring to FIG. 1B again, using a display image of a single-color having the highest gray-scale as an example to describe the charging of two pixel electrodes, Pixel n+2 and Pixel n+1, that coupled to a same second transistor T2. When the gate line Gate n is scanned, the second transistor T2 is in conduction state. Now Pixel n+2 and Pixel n+1 are in a charge-sharing state which is a pre-charging state, with a charge-sharing period being referred as t1. Next, Gate n+1 is turned on, the second transistor T2 is turned off. Now Pixel n+1 is charged through a first transistor T1 throughout a time period t3 until the gate line Gate n is (scanned) turned on next time. The time period t3 is called a charge-maintaining period for the Pixel n+1. At the same time, Pixel n+2 keeps the charge obtained during the pre-charging time or charge-sharing period t1. Further in sequential order, Gate n+2 is (scanned) turned on, the second transistor T2 also is turned off. Now, Pixel n+2 is charged through a second transistor T1 throughout a time period t2 until the gate line Gate n is (scanned) turned on next time. The time period t2 is referred as a charge-maintaining period for the Pixel n+2. Note, T3=t1+t2. The charge-sharing period t1 is extremely short comparing to the charge-maintaining period t2. For example, t1 is only equal to inverse of a product of a pixel refresh rate and total number of gate lines in the array substrate, which is only 1/60000 of t2. Therefore, the transient state of the charge-sharing state is substantially negligible relative to the charge-maintaining state to cause no noticeable effect on displayed image.

Figure 5A:
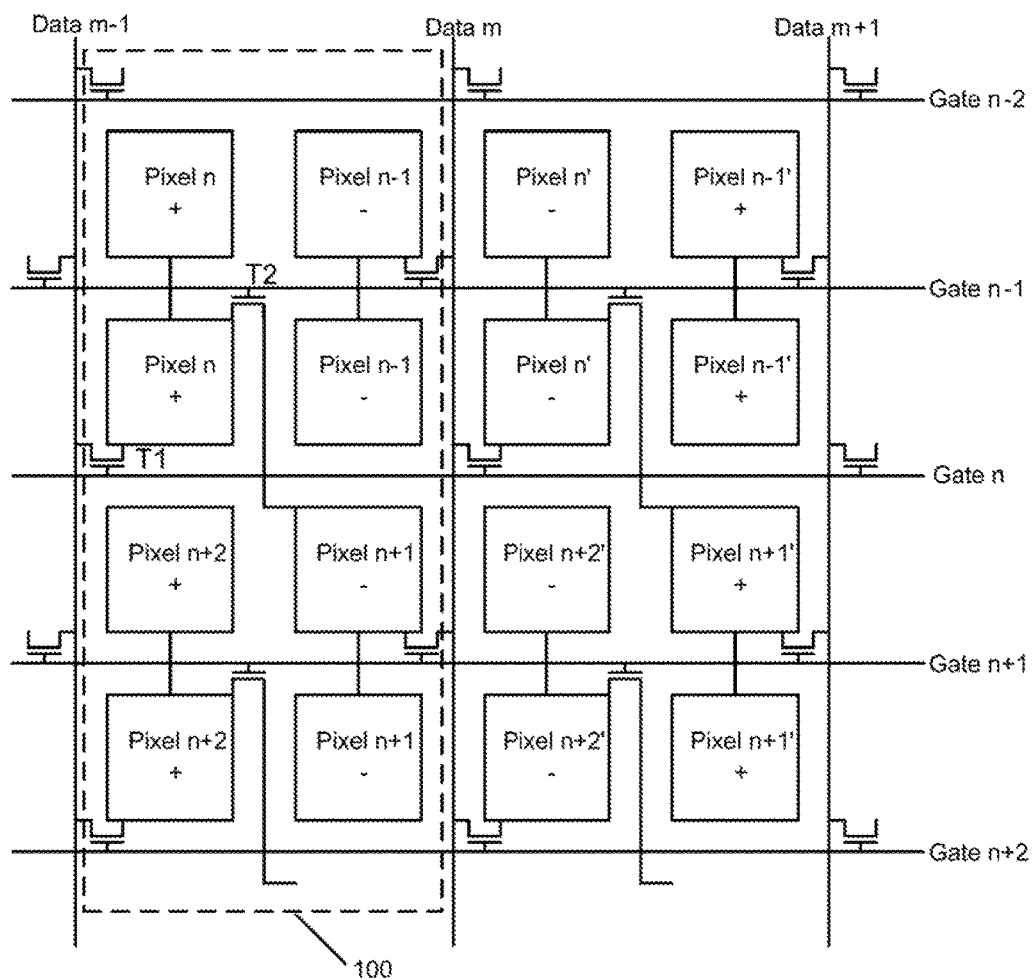
FIG. 5A is a schematic circuit diagram of an array substrate according to a first embodiment of the present disclosure.
Figure 5B:
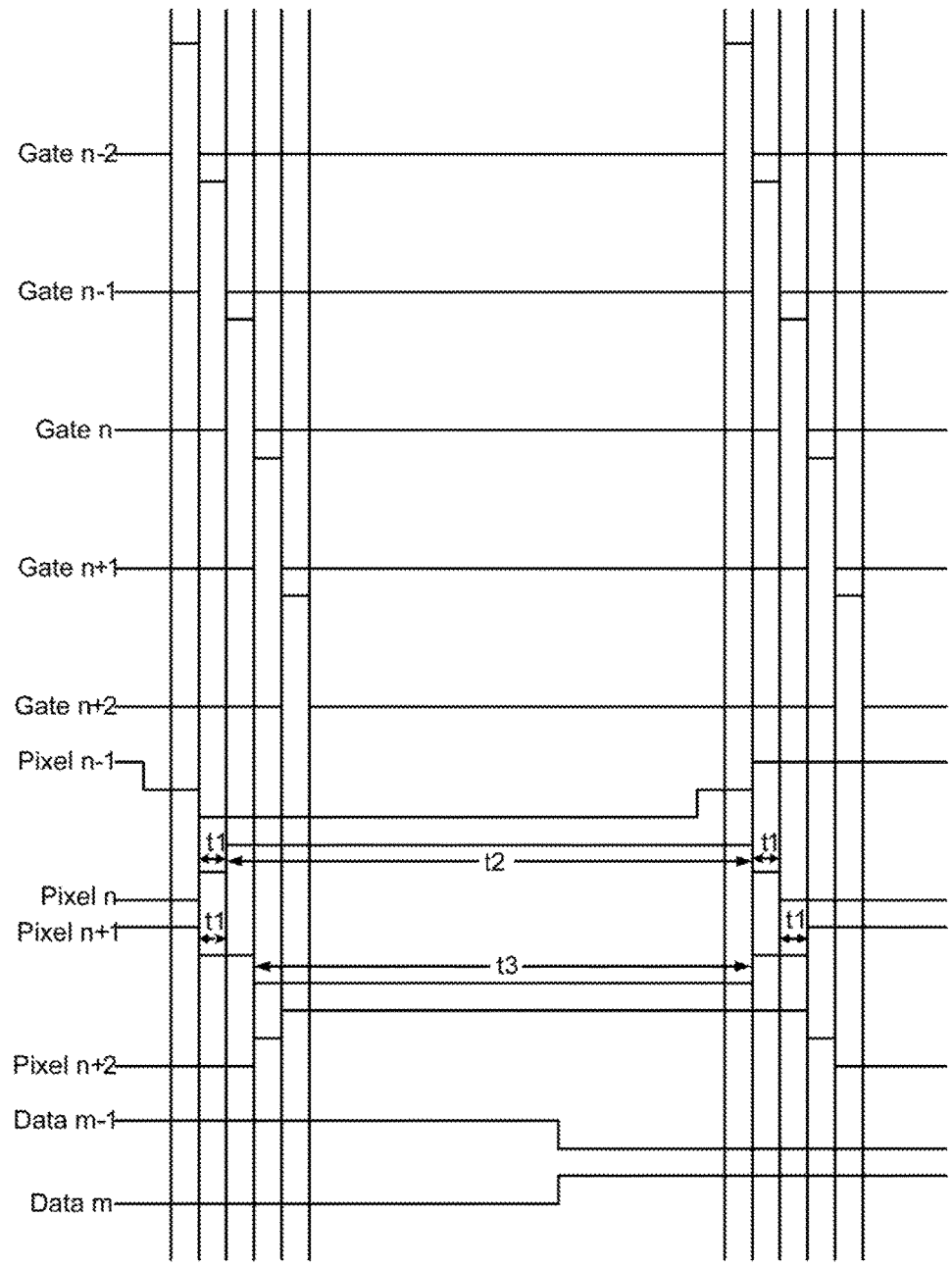
FIG. 5B is a timing waveform for operating the array substrate of FIG. 5A.

Alternatively, in the same column-reverse polarity scheme, for each group 100 of pixel electrodes two pixel electrodes in two adjacent rows and charged respectively through two adjacent gate lines have opposite or reversed polarities. Referring to FIG. 5A, except for those pixel electrodes associated with a gate line that is first scanned by a gate-driving control signal, any two pixel electrodes in two adjacent row but different columns having reversed polarities also can be mutually pre-charged through a second transistor T2. Specifically, in each group 100 of pixel electrodes, two pixel electrodes located at different rows are respectively coupled to a source terminal and a drain terminal of a second transistor T2. The gate of the second transistor T2 is coupled to a gate line Gate that is scanned in a previous nearest scanning cycle relative to a first gate line located between a top (first) portion and a bottom (second) portion of the first pixel electrodes of the two pixel electrodes mentioned above. For example, Pixel n and Pixel n+1 are mutually pre-charged through a second transistor T2 which has a gate terminal coupled to a gate line Gate n−1. Referring to FIG. 5B, each pixel electrode starts its charging operation after the neutralization of the revered positive-negative polarities. The starting potential level for charging is raised by 50%. Theoretically, this results in 50% power saving in logic circuitry operation and cuts the charging time by half.

Referring to FIG. 5B again, using a display image of a single-color having the highest gray-scale as an example, both Pixel n+2 and Pixel n+1 are coupled to a same second transistor T2 for a pre-charging operation. When the gate line Gate n+1 is scanned, the second transistor T2 is in conduction state. Now Pixel n and Pixel n+1 are in a charge-sharing state, i.e., the pre-charging state for a period of t1. When next gate line Gate n is scanned, the second transistor T2 is in blocking state. Now, Pixel n is charged through a first transistor T1 for a charge-maintaining period of t2 until the gate line Gate n−1 is scanned again next time. At the same time, Pixel n+1 keeps its charges associated with the pre-charging operation. Next, when Gate n+1 is scanned, the second transistor still is in blocking state. Pixel n+1 is now charged via a first transistor T1 for another charge-maintaining period t3 until the gate line Gate n−1 is scanned next time. Here, t3=t1+t2. The charge-sharing period t1 is extremely short comparing to the charge-maintaining period t2. For example, t1 is only equal to inverse of a product of a pixel refresh rate and total number of gate lines in the array substrate, which is only 1/60000 of t2. Therefore, the transient state of the charge-sharing state is substantially negligible relative to the charge-maintaining state to cause no noticeable effect on displayed image.

Embodiment II

Figure 6A:
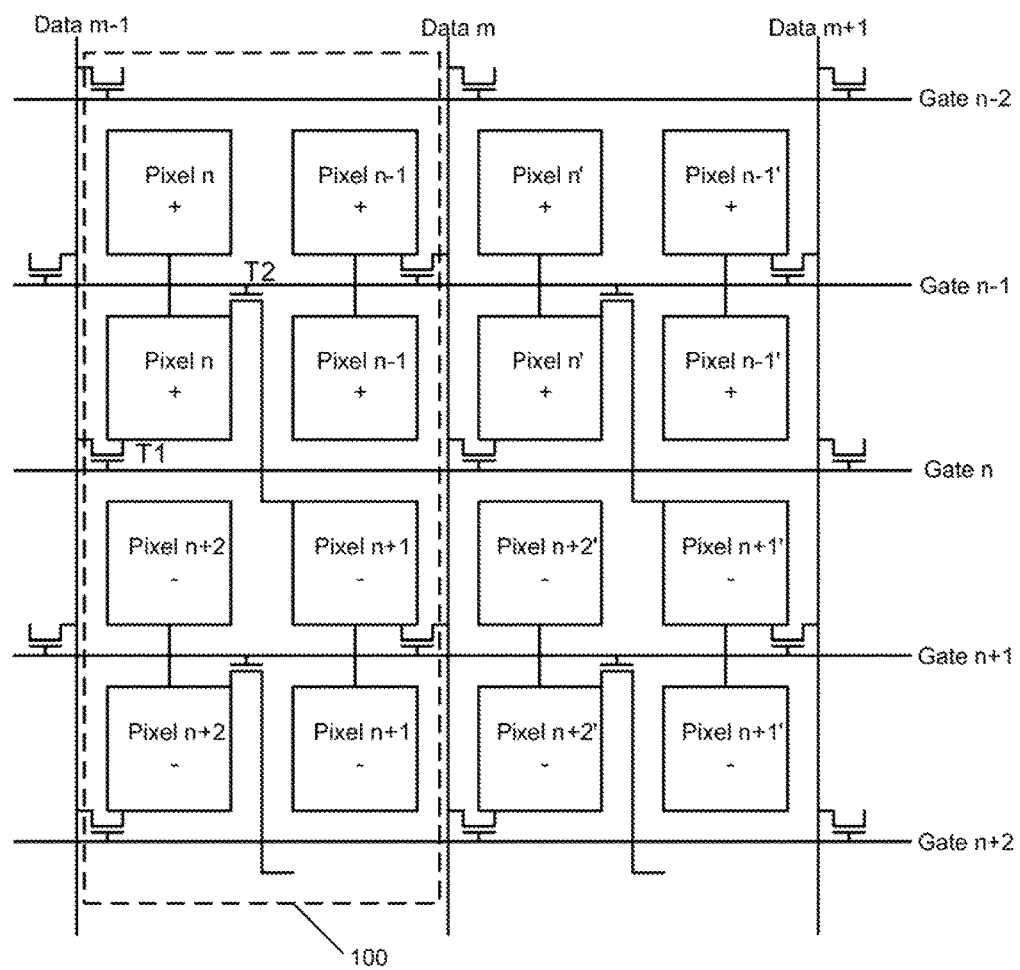
FIG. 6A is a first schematic circuit diagram of an array substrate according to a second embodiment of the present disclosure.
Figure 7A:
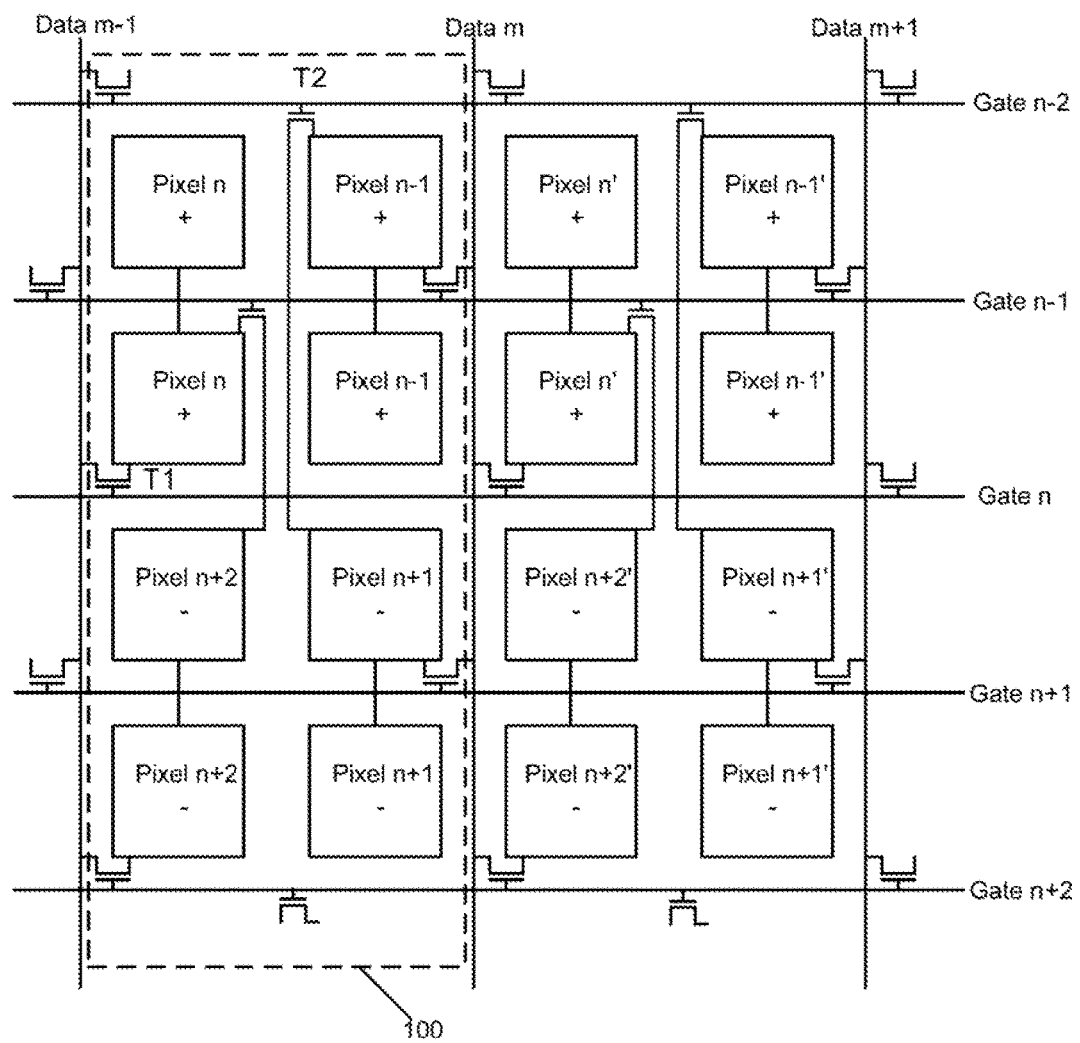
FIG. 7A is a second schematic circuit diagram of an array substrate according to the second embodiment of the present disclosure.

The array substrate is adopted a row-reverse polarity scheme for driving its operation. In other words, within each scanning cycle, when a row of pixel electrodes are charged each of the plurality of data lines is applied with data-line signals having a same polarity which is reversed from a previous one when a previous adjacent row of pixel electrodes was charged. As shown in FIG. 6A and FIG. 7A, all pixel electrodes in a same row have the same polarity. Pixel electrodes in adjacent rows have opposite or reversed polarities. For example, the polarity of a first row of pixel electrodes is positive and the polarity of an adjacent second row of pixel electrodes is negative.

In the row-reverse polarity scheme, for each group 100 of pixel electrodes, except for those pixel electrodes associated with a gate line that is first scanned by a gate-driving control signal, every two pixel electrodes of two adjacent rows having reversed polarities can be mutually pre-charged through a second transistor T2. Specifically, the second transistor T2 can be coupled in at least two options. A first option is shown in FIG. 6A, two pixel electrodes located diagonally (at two adjacent rows and two adjacent columns at the same time) are coupled through the second transistor T2 for mutually pre-charging. Within each group 100 of pixel electrodes, two pixel electrodes in two adjacent rows and two adjacent columns are respectively coupled to a source terminal and a drain terminal of the second transistor T2. The gate of the second transistor T2 is coupled to a gate line being a previous adjacent gate line scanned one cycle before the first pixel electrode of the two pixel electrodes. For example, both the first pixel electrode Pixel n and the second pixel electrode Pixel n+1 are coupled to a second transistor T2 for mutually pre-charging. The gate terminal of the second transistor T2 is coupled to a previous adjacent gate line Gate n−1. Referring to FIG. 6B, each pixel electrode starts its charging operation after the neutralization of the revered positive-negative polarities. The starting potential level for charging is raised by 50%. Theoretically, this results in 50% power saving in logic circuitry operation and cuts the charging time by half.

Referring to FIG. 6B again, using a display image of a single-color having the highest gray-scale as an example to describe the charging of two pixel electrodes, Pixel n and Pixel n+1, that coupled to a same second transistor T2. When gate line Gate n−1 is turned on, the second transistor T2 is in conduction state to make the Pixel n and Pixel n+1 to be a charge-sharing state, i.e., a pre-charging state in a charge-sharing period t1. Next, the gate line Gate n is turned on and the second transistor T2 is in blocking state. The Pixel n is charged through a first transistor T1 through a charge-maintaining period 12 until Gate n−1 is scanned next time after scanning through all the plurality of gate lines in the array substrate. At the same time, Pixel n+1 keeps its charges the same as the pre-charging period. When the next gate line Gate n+1 is scanned, the second transistor T2 also is in blocking state. Now, Pixel n+1 is charged via a first transistor T1 through a charge-maintaining period 13 until the Gate n−1 is scanned next time. Here, t3=t1+t2. The charge-sharing period t1 is extremely short comparing to the charge-maintaining period t2. For example, t1 is only equal to inverse of a product of a pixel refresh rate and total number of gate lines in the array substrate, which is only 1/60000 of t2. Therefore, the transient state of the charge-sharing state is substantially negligible relative to the charge-maintaining state to cause no noticeable effect on displayed image.

Figure 7B:
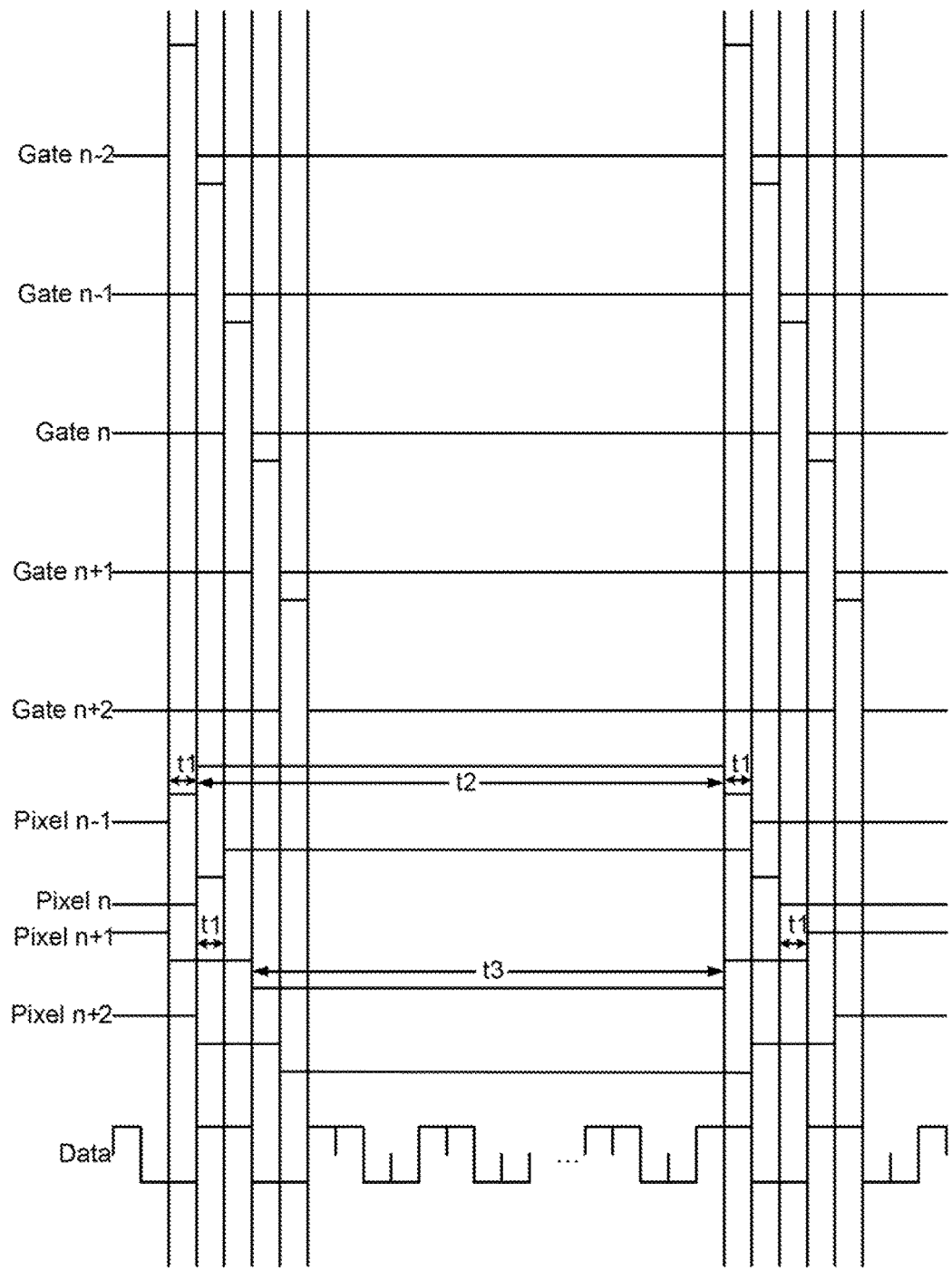
FIG. 7B is a timing waveform for operating the array substrate of FIG. 7A.

Alternatively, in the same row-reverse polarity scheme, a second option for connecting the second transistor T2 to two adjacent pixel electrodes in a same column having reversed polarities for mutually pre-charging, as shown in FIG. 7A. For each group 100 of pixel electrodes two pixel electrodes in two different rows of the same column are respectively coupled to a source terminal and a drain terminal of a second transistor T2. The gate terminal of the second transistor T2 is coupled to a gate line located in a row that is previous adjacent relative to the first row of the two different rows, the first row being scanned first. For example, the gate of the second transistor T2 is coupled to the gate line Gate n−2. As seen in FIG. 7B, each pixel electrode starts its charging operation after the neutralization of the revered positive-negative polarities. The starting potential level for charging is raised by 50%. Theoretically, this results in 50% power saving in logic circuitry operation and cuts the charging time by half.

Referring to FIG. 7B again, using a display image of a single-color having the highest gray-scale as an example to describe the charging of two pixel electrodes, Pixel n−1 and Pixel n+1, that coupled to a same second transistor T2. When the gate line Gate n−2 is turned on, the second transistor T2 is in conduction state to make both Pixel n−1 and Pixel n+1 in a charge-sharing state, i.e., a pre-charging state. It lasts for a charge-sharing period of t1. Then a next gate line Gate n−1 is turned on and the second transistor T2 is turned off. Now Pixel n−1 is charged via a first transistor T1 for a charge-maintaining period t2 until Gate n−2 is scanned (or turned on) next time after scanning through total number of gate lines in the array substrate. At the same time, Pixel n+1 retains charges at pre-charging state. After Gate n is turned on, the gate line Gate n is turned on. The second transistor T2 still is in blocking state. Now Pixel n+1 is charged via a first transistor T1. It lasts a charge-maintaining period of t3 until Gate n−2 is turned on again next time. Here, t2=2×t1+t3. The charge-sharing period t1 is extremely short comparing to the charge-maintaining period t2. For example, t1 is only equal to inverse of a product of a pixel refresh rate and total number of gate lines in the array substrate, which is only 1/60000 of t2. Therefore, the transient state of the charge-sharing state is substantially negligible relative to the charge-maintaining state to cause no noticeable effect on displayed image.

Embodiment III

Figure 8A:
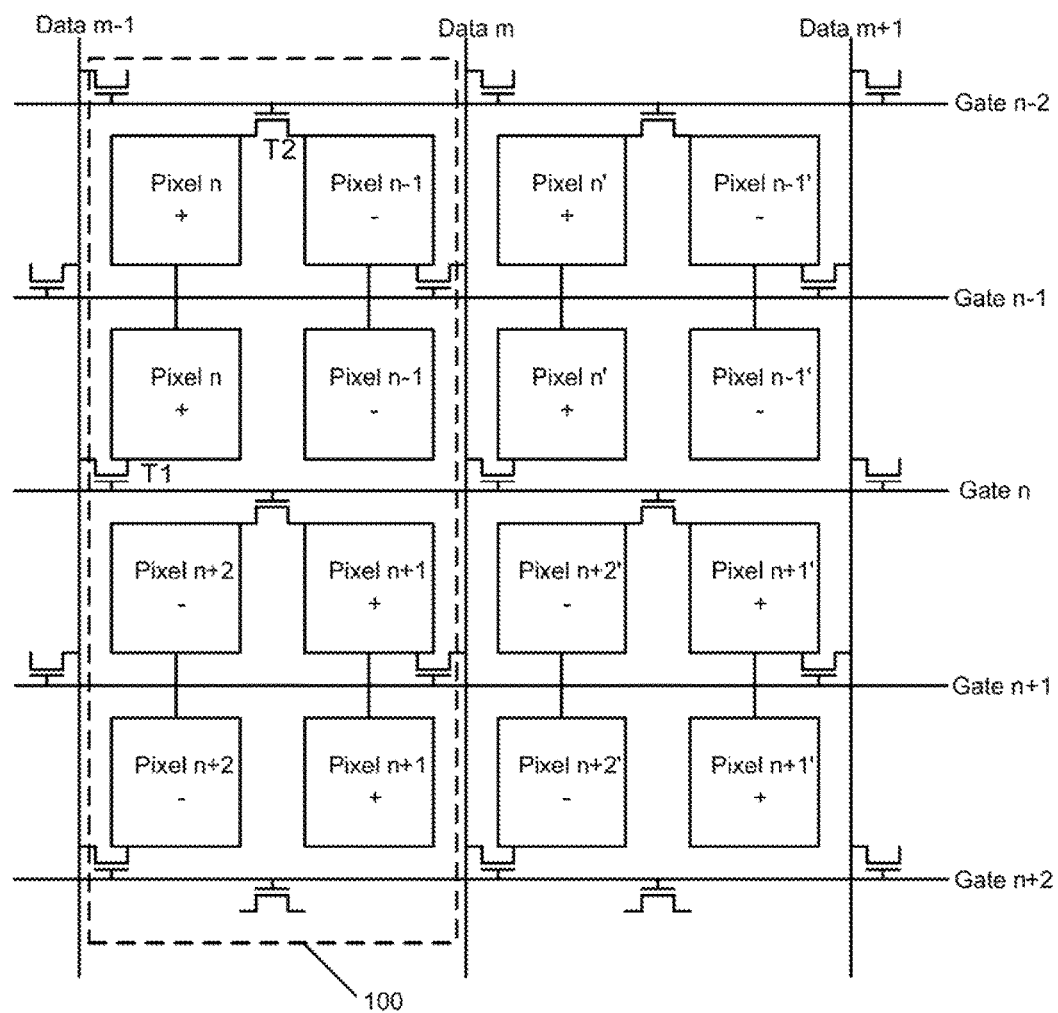
FIG. 8A is a first schematic circuit diagram of an array substrate according to a third embodiment of the present disclosure.
Figure 9A:
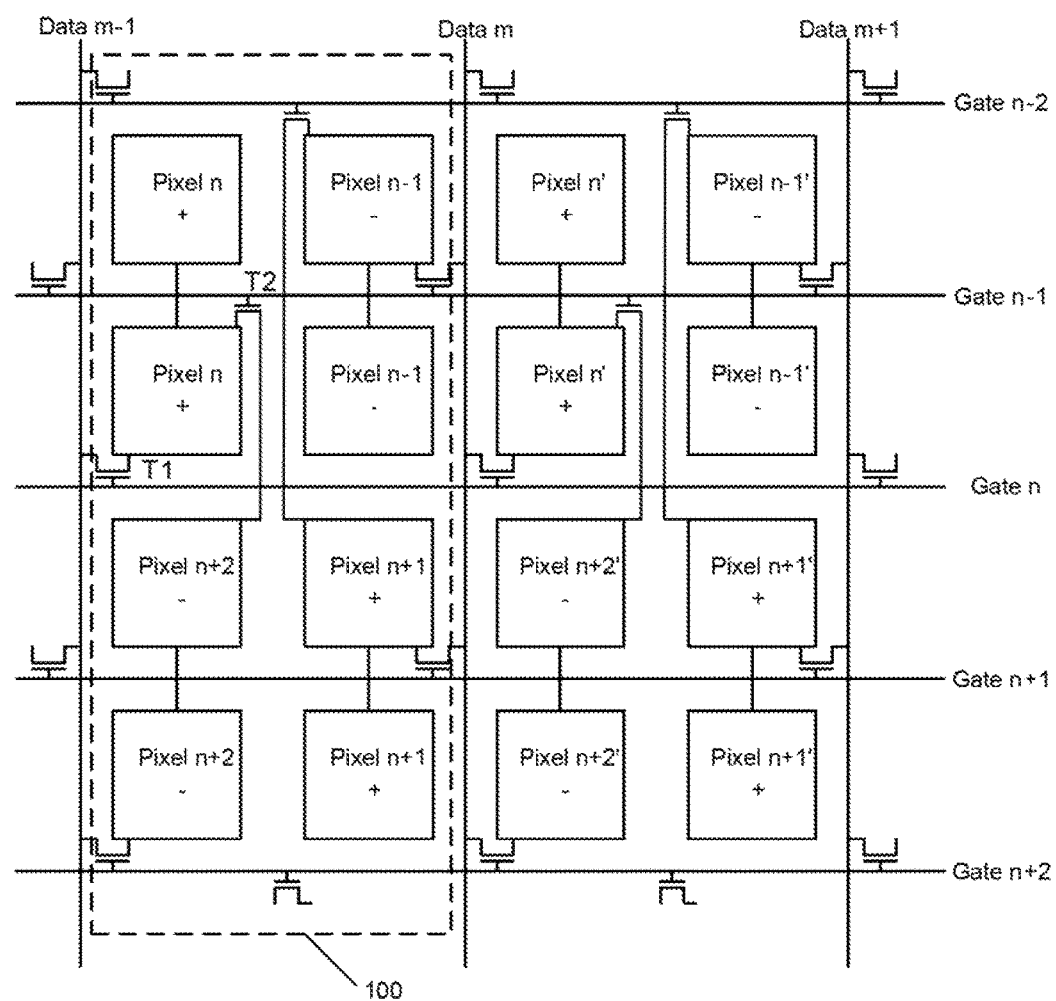
FIG. 9A is a second schematic circuit diagram of an array substrate according to the third embodiment of the present disclosure.

The array substrate is adopted a point-reverse polarity scheme for driving its operation. In other words, within each scanning cycle, when a row of pixel electrodes is charged each of the plurality of data lines is applied with a data-line signal having a reversed polarity of a previous signal applied to a previous adjacent row of pixel electrodes when it was charged. Additionally, every two adjacent data lines are applied with data-line signals of reversed polarities. As shown in FIG. 8A and FIG. 9A, any two adjacent pixel electrodes have opposite polarities. In other words, two pixel electrodes in two adjacent rows have opposite polarities and two pixel electrodes in two adjacent columns also have opposite polarities.

In the point-reverse polarity scheme, for each group 100 of pixel electrodes, except for those pixel electrodes associated with a gate line that is first scanned by a gate-driving control signal, every two adjacent pixel electrodes having reversed polarities can be mutually pre-charged through a second transistor T2. Specifically, there are at least two options for connecting the second transistor T2. One option is shown in FIG. 8A. Two adjacent pixel electrodes in a same row are coupled to a second transistor T2 for pre-charging each other. For each group 100 of pixel electrodes, two pixel electrodes in the same row are respectively coupled to a source terminal and a drain terminal of the second transistor T2. The gate terminal of the second transistor T2 is coupled to a gate line located in a row that is previous adjacent relative to the present row. For example, Pixel n+1 and Pixel n+2 are coupled to a second transistor T2 for pre-charging each other. The gate of the second transistor T2 is coupled to Gate n. As seen in corresponding timing waveform for operating the array substrate of FIG. 8A, each pixel electrode starts its charging operation after the neutralization of the revered positive-negative polarities. The starting potential level for charging is raised by 50%. Theoretically, this results in 50% power saving in logic circuitry operation and cuts the charging time by half.

Figure 8B:
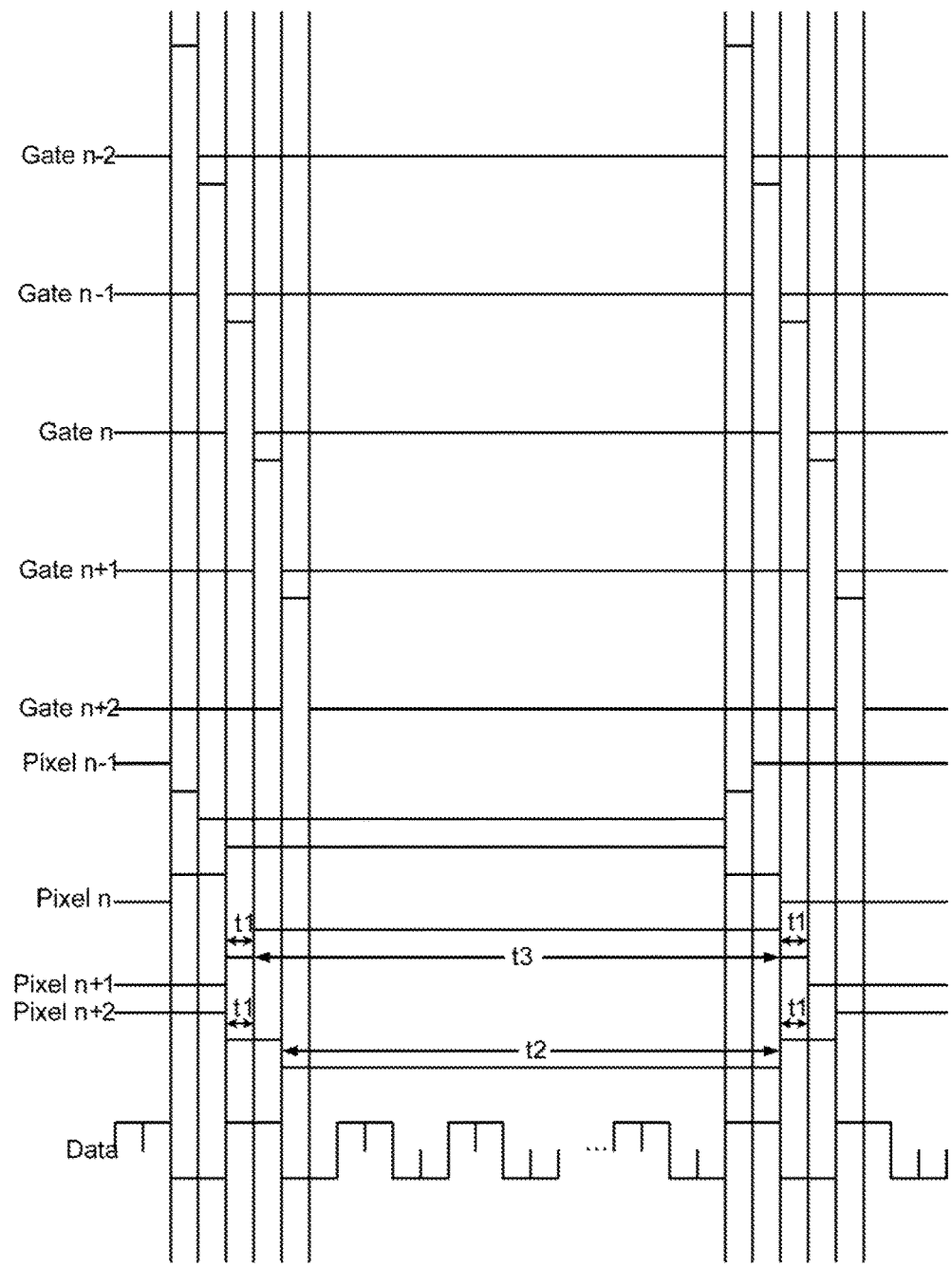
FIG. 8B is a timing waveform for operating the array substrate of FIG. 8A.

Referring to FIG. 8B, using a display image of a single-color having the highest gray-scale as an example to describe the charging of two pixel electrodes, Pixel n+1 and Pixel n+2, that coupled to a same second transistor T2. When the gate line Gate n is turned on, the second transistor T2 is in conduction state. Now both Pixel n+1 and Pixel n+2 are in charge-sharing state, i.e., a pre-charging state, for a charge-sharing period of t1. Then gate line Gate n+1 is turned on and the second transistor T2 is turned off. Now, Pixel n+1 is being charged via a first transistor T1 for a charge-maintaining period of t2 until the Gate n is turned on again next time. At the same time, Pixel n+2 retains charges at the pre-charging state. Next, the gate line Gate n+2 is turned on and the second transistor T2 is still in blocking state. Now, Pixel n+2 is being charged via a first transistor T1 for another charge-maintaining period of t3 until Gate n is turned on again next time. Here, t3=t1+t2. The charge-sharing period t1 is extremely short comparing to the charge-maintaining period t2. For example, t1 is only equal to inverse of a product of a pixel refresh rate and total number of gate lines in the array substrate, which is only 1/60000 of t2. Therefore, the transient state of the charge-sharing state is substantially negligible relative to the charge-maintaining state to cause no noticeable effect on displayed image.

Figure 9B:
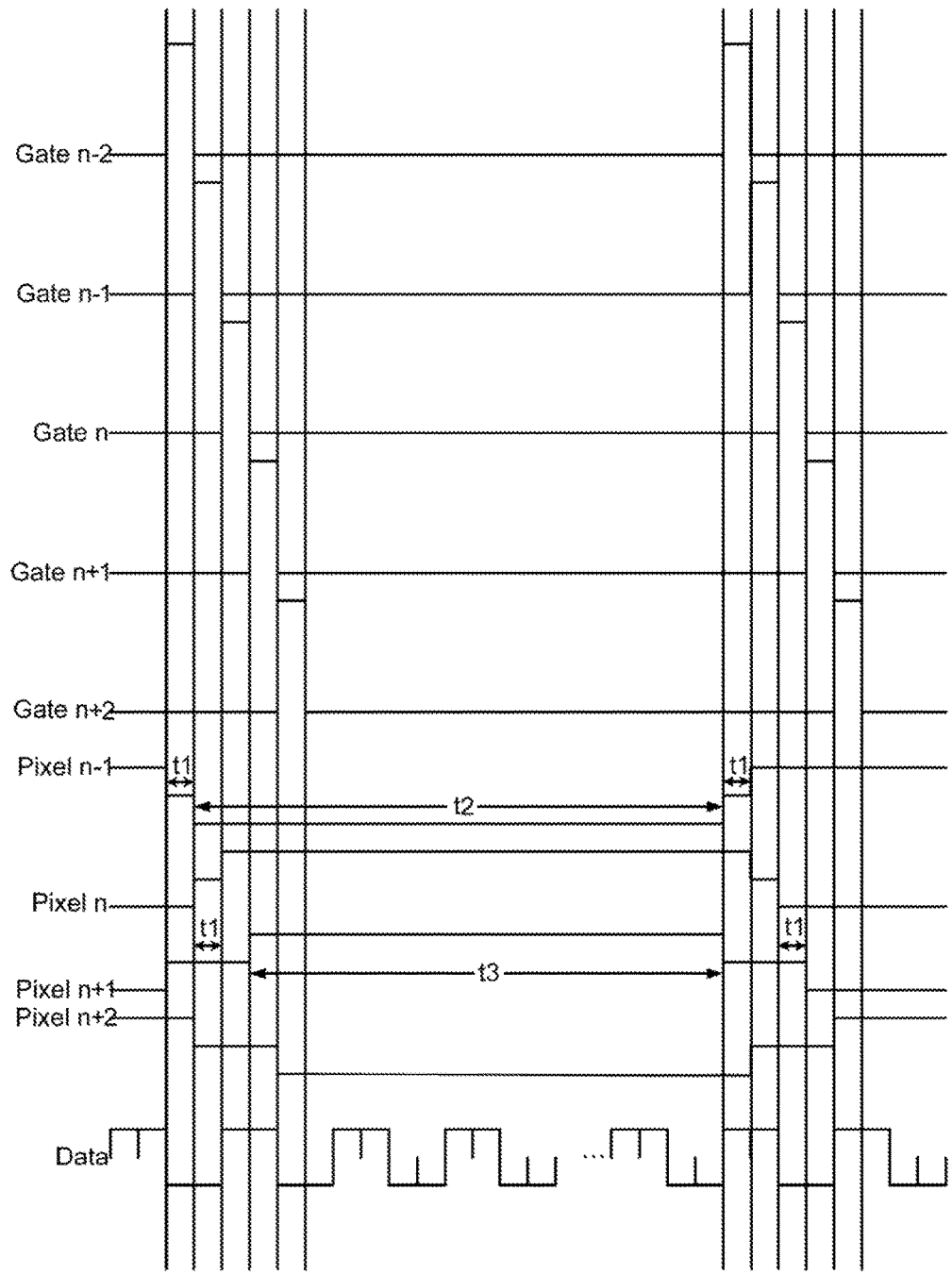
FIG. 9B is a timing waveform for operating the array substrate of FIG. 9A.

Alternatively, in the point-reverse polarity scheme, another option of connecting the second transistor T2 is shown in FIG. 9A. Any two adjacent pixel electrodes in a same column are coupled to the second transistor for pre-charging each other. Within each group 100 of pixel electrodes, two pixel electrodes in the same column are respectively coupled to a source terminal and a drain terminal of the second transistor T2. The gate of the second transistor T2 is coupled to a gate line located in a row that is previous adjacent relative to the first row of the two pixel electrodes in the same column, the first row being scanned first. For example, both Pixel n−1 and Pixel n+1 are coupled to the second transistor T2 for pre-charging each other. The gate of the second transistor T2 is coupled to the gate line Gate n−2. As seen in the timing waveform diagram shown in FIG. 9B, each pixel electrode starts its charging operation after the neutralization of the revered positive-negative polarities. The starting potential level for charging is raised by 50%. Theoretically, this results in 50% power saving in logic circuitry operation and cuts the charging time by half.

Referring to FIG. 9B again, using a display image of a single-color having the highest gray-scale as an example to describe the charging of two pixel electrodes, Pixel n−1 and Pixel n+1, that coupled to a same second transistor T2. When the gate line Gate n−2 is turned on, the second transistor T2 is in conduction state. Now both Pixel n−1 and Pixel n+1 are in charge-sharing state, i.e., a pre-charging state, for a charge-sharing period of t1. Then gate line Gate n−1 is turned on and the second transistor T2 is turned off. Now, Pixel n−1 is being charged via a first transistor T1 for a charge-maintaining period of t2 until the Gate n−2 is turned on again next time. At the same time, Pixel n+1 retains charges at the pre-charging state. After Gate n is turned on, the gate line Gate n+1 is turned on and the second transistor T2 is still in blocking state. Now, Pixel n+1 is being charged via a first transistor T1 for another charge-maintaining period of t3 until Gate n−2 is turned on again next time. Here, t2=2×t1+t3. The charge-sharing period t1 is extremely short comparing to the charge-maintaining period t2. For example, t1 is only equal to inverse of a product of a pixel refresh rate and total number of gate lines in the array substrate, which is only 1/60000 of t2. Therefore, the transient state of the charge-sharing state is substantially negligible relative to the charge-maintaining state to cause no noticeable effect on displayed image.

Comparing the three Embodiments described in details above, the column-reverse polarity scheme requires the least reversal for the data line signal applied to respective data line Data. Thus, it provides a scheme with the most power saving.

Accordingly, the present disclosure provides, inter alia, an array substrate, a display panel, and a display apparatus having the same, and a driving method thereof that substantially obviate one or more of the problems due to limitations and disadvantages of the related art. In one aspect, a method for driving the array substrate disclosed throughout the specification is provided to raise potential level of a pair of pixel electrodes having reversed polarities by a pre-charging operation before charging each pixel electrode upon sequentially activating the plurality of gate lines one by one in a series of scanning cycles.

In some embodiments, the method includes, in each scanning cycle, applying signals of reversed polarities to any two adjacent data lines. Optionally, the method further includes turning on the second transistor to allow charge sharing between the two pixel electrodes having reversed polarities, before each pixel electrode is charged via the first transistor.

In some embodiments, the method includes, in each scanning cycle, applying signals of a first polarity to each data line while charging a current row of pixel electrodes. The first polarity is reversed relative to a second polarity for signals applied to each data line while charging a previous adjacent row of pixel electrodes. Optionally, each pixel electrode being pre-charged from an adjacent data line with reversed polarity via the second transistor before being normally charged from a currently coupled data line via the first transistor.

In some embodiments, the method includes, in each scanning cycle, applying signals of two reversed polarities to every two adjacent data lines while charging a current row of pixel electrodes, the polarity on each data line being reversed relative to a polarity on the same each data line while charging a previous adjacent row of pixel electrodes. Optionally, each pixel electrode being pre-charged from one of the two adjacent data lines polarity via the second transistor before being normally charged from another one of the two adjacent data lines having reversed polarity via the first transistor.

In an alternative embodiment, the present disclosure also provides a liquid crystal display panel that contains an array substrate on which the array substrate described above is fabricated.

In another alternative embodiment, the present disclosure also provides an electroluminescent display panel that contains an array substrate on which the array substrate described above is fabricated. Specifically, the electroluminescent display panel adopts an organic light-emitting diode (OLED) as each light-emitting element of each pixel.

In yet another alternative embodiment, the present disclosure provides a display apparatus including the liquid crystal display panel or the electroluminescent display panel. The display apparatus can be implemented in mobile phone, tablet computer, television set, displaying device, notebook computer, digital picture frame, and navigation device based on GPS or other navigation technology, or any products or components that have an image display function.

The present disclosure provides the as-described array substrate and its driving method, a liquid crystal display panel or electroluminescent display panel containing the array substrate, and a display apparatus made by one of the above display panels. The array substrate is based on an improved dual-gate layout scheme and formed by multiple groups of pixel electrodes, each group including two columns of pixel electrodes without any data line being laid in between. Within each group of pixel electrodes, multiple second transistors, in addition to original first transistor for charging each pixel electrode, are disposed without crossing over any data line to cause signal crosstalk issue. Two pixel electrodes in each group having opposite (or reversed) polarities, except for those pixel electrodes coupled to a first gate line of the array substrate, are coupled to the second transistor for pre-charging each other. Thus, before each pixel electrode is charged via a corresponding first transistor the second transistor is turned on to perform a charge sharing operation among the two pixel electrodes having reversed polarities to have a neutralization of charges thereof. This raises starting potential level of each pixel electrode before being charged so that charging time is reduced and power saving is achieved. In some embodiments, all products according to the current disclosure mentioned above not only help saving cost by applying the dual-gate structure for the array substrate but also achieve a function for fast charging with enhanced pixel refreshing rate by adding the second transistor to perform a pre-charging operation. Using charge-sharing to perform the pre-charging operation also reduce power used in logic circuitry pixel driving operation.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate comprising: a plurality of pixel electrodes arranged in a matrix; a plurality of data lines laid in a column direction; a plurality of gate lines laid in a row direction sequentially scanned row-by-row along the column direction in a plurality of scanning cycles; a plurality of first transistors configured to control charging of the plurality of pixel electrodes respectively; and a plurality of second transistors configured to control pre-charging of the plurality of pixel electrodes respectively;

wherein every two adjacent columns of pixel electrodes in the array substrate form a group of pixel electrodes; the plurality of data lines and a plurality of groups of pixel electrodes are alternately disposed along the row direction; the plurality of data lines being absent between the two adjacent columns of pixel electrodes in a same group of pixel electrodes;

each row of pixel electrodes is associated with two adjacent gate lines of the plurality of gate lines; any two adjacent pixel electrodes in each row at two opposite sides of any data line are coupled to the same data line respectively through two first transistors, and respectively coupled through the two first transistors to the two adjacent gate lines associated with the each row;

each second transistor within the group of pixel electrodes is coupled to two pixel electrodes having respective polarities reversed during a scanning cycle for mutually sharing charges between the two pixel electrodes within the scanning cycle.

2. The array substrate of claim 1, wherein each pixel electrode in one row of pixel electrodes comprises a first portion and a second portion arranged in the column direction and coupled by a conducting line, wherein one of the two adjacent gate lines associated with the row of pixel electrodes is disposed between the first portion and the second portion and another of the two adjacent gate lines associated with the row of pixel electrodes is disposed between the row of pixel electrodes and an adjacent row of pixel electrodes.

3. The array substrate of claim 2, wherein the first portion and the second portion have a substantially the same area.

4. The array substrate of claim 1, wherein the plurality of first transistors have a common gate layout toward one direction.

5. The array substrate of claim 1, wherein each first transistor coupled to one of the two adjacent gate lines associated with each row of pixel electrodes has a common gate layout towards a first direction and each first transistor coupled to another of the two adjacent gate lines associated with each row of pixel electrodes has a common gate layout towards a second direction, the second direction being opposite to the first direction.

6. The array substrate of claim 1, wherein the two adjacent gate lines associated with the each row of pixel electrodes is laid between two adjacent rows of pixel electrodes.

7. The array substrate of claim 1, wherein for each group of pixel electrodes, except for those pixel electrodes associated with a first gate line of the array substrate that is firstly scanned in a first scanning cycle of the plurality of scanning cycles, each second transistor comprises a gate coupled to a pre-charge gate line and two terminals respectively coupled to two adjacent pixel electrodes in a row of pixel electrodes having reversed polarities from column to column, wherein the pre-charge gate line is one of the plurality of gate lines associated with an adjacent row of pixel electrodes scanned in a previous scanning cycle.

8. The array substrate of claim 1, wherein for each group of pixel electrodes, except for those pixel electrodes associated with a first gate line of the array substrate that is firstly scanned in a first scanning cycle of the plurality of scanning cycles, each second transistor comprises a gate coupled to a pre-charge gate line and two terminals respectively coupled to two adjacent pixel electrodes in a row of pixel electrodes having reversed polarities both from row to row and from column to column, wherein the pre-charge gate line is one of the plurality of gate lines associated with an adjacent row of pixel electrodes scanned in a previous scanning cycle.

9. The array substrate of claim 1, wherein for each group of pixel electrodes, except for those pixel electrodes associated with a first gate line of the array substrate that is firstly scanned in a first scanning cycle of the plurality of scanning cycles, each second transistor comprises a gate coupled to a pre-charge gate line and two terminals respectively coupled to a first pixel electrode and a second pixel electrode having reversed polarities from column to column, the first pixel electrode being in a first column of a row and the second pixel electrode being in an adjacent second column of a next adjacent row, wherein the pre-charge gate line is a first of two gate lines associated with the row of pixel electrodes where the first pixel electrode belong and scanned in a current scanning cycle.

10. The array substrate of claim 1, wherein for each group of pixel electrodes, except for those pixel electrodes associated with a first gate line of the array substrate that is firstly scanned in a first scanning cycle of the plurality of scanning cycles, each second transistor comprises a gate coupled to a pre-charge gate line and two terminals respectively coupled to a first pixel electrode and a second pixel electrode having reversed polarities from row to row, the first pixel electrode being in a column of a row and the second pixel electrode being in a next adjacent column of a next adjacent row, wherein the pre-charge gate line is a first of two gate lines associated with the row of pixel electrodes where the first pixel electrode belong and scanned in a current scanning cycle.

11. The array substrate of claim 1, wherein the plurality of second transistors comprises a first set of second transistors paired with a second set of second transistors, each of the first set of second transistors within a group of pixel electrodes comprises a gate coupled to a first pre-charge gate line and two terminals respectively coupled to two adjacent pixel electrodes in a first column of two adjacent rows having reversed polarities from row to row, each of the second set of second transistors within the same group of pixel electrodes comprises a gate coupled to a second pre-charge gate line and two terminals respectively coupled to two adjacent pixel electrodes in a second column of a same two adjacent rows, wherein the first pre-charge gate line is a first of two gate lines associated with a first row of the two adjacent rows of pixel electrodes and scanned in a current scanning cycle, the second pre-charge gate line is one of the plurality of gate lines associated with a previous adjacent row of pixel electrodes and scanned in a previous scanning cycle nearest to a current scanning cycle for scanning a first of two gate lines associated with the first row of the two adjacent rows.

12. The array substrate of claim 1, wherein the plurality of second transistors comprises a first set of second transistors paired with a second set of second transistors, each of the first set of second transistors within a group of pixel electrodes comprises a gate coupled to a first pre-charge gate line and two terminals respectively coupled to two adjacent pixel electrodes in a first column of two adjacent rows having reversed polarities both from row to row and from column to column, each of the second set of second transistors within the same group of pixel electrodes comprises a gate coupled to a second pre-charge gate line and two terminals respectively coupled to two adjacent pixel electrodes in a second column of a same two adjacent rows, wherein the first pre-charge gate line is a first of two gate lines associated with a first row of the two adjacent rows of pixel electrodes and scanned in a current scanning cycle, the second pre-charge gate line is one of the plurality of gate lines associated with a previous adjacent row of pixel electrodes and scanned in a previous scanning cycle nearest to a current scanning cycle for scanning a first of two gate lines associated with the first row of the two adjacent rows.

13. The array substrate of claim 1, wherein each row of pixel electrodes is configured to have a same polarity within each scanning cycle and each adjacent row of pixel electrodes is configured to have a reversed polarity relative to previously said row of pixel electrodes, for each group of pixel electrodes, except for those pixel electrodes associated with a first gate line of the array substrate that is firstly scanned in a first of the plurality of scanning cycles, every two pixel electrodes located at the two adjacent rows having reversed polarities are mutually pre-charged via one of the plurality of second transistors within the scanning cycle.

14. The array substrate of claim 1, wherein any two columns of pixel electrodes coupled to a same data line are configured to have a same polarity within each scanning cycle and two adjacent columns of pixel electrodes respectively coupled to two adjacent data lines are configured to have a reversed polarity relative to previously said two columns of pixel electrodes, for each group of pixel electrodes, except for those pixel electrodes associated with a first gate line of the array substrate that is firstly scanned in a first of the plurality of scanning cycles, every two pixel electrodes at the two adjacent columns having reversed polarities are mutually pre-charged via one of the plurality of second transistors within the scanning cycle.

15. The array substrate of claim 1, wherein every two adjacent pixel electrodes having reversed polarities within each scanning cycle, for each group of pixel electrodes, except for those pixel electrodes associated with a first gate line of the array substrate that is firstly scanned in a first of the plurality of scanning cycles, every two pixel electrodes respectively at two adjacent rows or at two adjacent columns having reversed polarities are mutually pre-charged via one of the plurality of second transistors within the scanning cycle.

16. The array substrate of claim 1, wherein the plurality of gate lines comprises a first set of gate lines respectively coupled to a set of second transistors and a second set of gate lines without coupled to any second transistors, each of the first set of gate lines comprises a line width wider than that of each of the second set of gate lines.

17. A display apparatus comprising the array substrate of claim 1.

18. A method for driving an array substrate of claim 1 upon sequentially scanning the plurality of gate lines one by one in a series of scanning cycles, the method comprising, in each scanning cycle, applying signals of reversed polarities to any two adjacent data lines; and
    turning on the second transistor to allow charge sharing between the two pixel electrodes having reversed polarities, before each pixel electrode is charged via the first transistor.

19. A method for driving an array substrate of claim 1 upon sequentially scanning the plurality of gate lines one by one in a series of scanning cycles, the method comprising, in each scanning cycle, applying signals of a first polarity to each data line while charging a current row of pixel electrodes, the first polarity being reversed relative to a second polarity for signals applied to each data line while charging a previous adjacent row of pixel electrodes, each pixel electrode being pre-charged from an adjacent data line with reversed polarity via the second transistor before being normally charged from a currently coupled data line via the first transistor.

20. A method for driving an array substrate of claim 1 upon sequentially scanning the plurality of gate lines one by one in a series of scanning cycles, the method comprising, in each scanning cycle, applying signals of two reversed polarities to every two adjacent data lines while charging a current row of pixel electrodes, each pixel electrode being pre-charged from one of the two adjacent data lines polarity via the second transistor before being normally charged from another one of the two adjacent data lines having reversed polarity via the first transistor, the polarity on each data line being reversed relative to a polarity on the same each data line while charging a previous adjacent row of pixel electrodes.

\* \* \* \* \*